US 9,978,726 B2

(12) United States Patent
Rhee et al.

(10) Patent No.: US 9,978,726 B2
(45) Date of Patent: May 22, 2018

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Byungjoon Rhee, Seoul (KR); Kyuhyun Bang, Seoul (KR); Hwanjoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 20 days.

(21) Appl. No.: 15/140,147

(22) Filed: Apr. 27, 2016

(65) Prior Publication Data

US 2017/0170151 A1    Jun. 15, 2017

(30) Foreign Application Priority Data

Dec. 11, 2015  (KR) .................... 10-2015-0177301

(51) Int. Cl.
| | |
|---|---|
| *H01L 33/54* | (2010.01) |
| *H01L 25/07* | (2006.01) |
| *H01L 25/075* | (2006.01) |
| *H01L 33/62* | (2010.01) |
| *G06F 1/16* | (2006.01) |
| *G02F 1/1333* | (2006.01) |

(52) U.S. Cl.
CPC ........ *H01L 25/0753* (2013.01); *G06F 1/1652* (2013.01); *H01L 33/54* (2013.01); *H01L 33/62* (2013.01); *G02F 1/133305* (2013.01); *H01L 2933/0016* (2013.01); *H01L 2933/0066* (2013.01)

(58) Field of Classification Search
CPC ......... H01L 33/54; H01L 33/62; H01L 29/00; H01L 27/07; H01L 27/075; H01L 27/0753
USPC .......................................... 257/88
See application file for complete search history.

(56) References Cited

U.S. PATENT DOCUMENTS

| | | | |
|---|---|---|---|
| 2011/0068359 | A1 | 3/2011 | Yahata et al. |
| 2011/0254029 | A1 | 10/2011 | Lai |
| 2015/0221619 | A1 | 8/2015 | Rhee |
| 2015/0255505 | A1* | 9/2015 | Jeoung .................. G06F 1/1652 257/89 |

FOREIGN PATENT DOCUMENTS

| | | |
|---|---|---|
| JP | 2014-150140 A | 8/2014 |
| KR | 10-2011-0031099 A | 3/2011 |
| KR | 10-1452768 B1 | 10/2014 |
| KR | 10-2015-0097991 A | 8/2015 |

* cited by examiner

*Primary Examiner* — Monica D Harrison
(74) *Attorney, Agent, or Firm* — Birch, Stewart, Kolasch & Birch, LLP

(57) ABSTRACT

A display device including a substrate including a wiring electrode; a plurality of semiconductor light emitting devices electrically connected to the wiring electrode; and an intermediate electrode extending along one direction to be electrically connected to conductive electrodes of adjoining semiconductor light emitting devices, covering the conductive electrodes, and facing the wiring electrode to be electrically connected to the wiring electrode.

20 Claims, 20 Drawing Sheets

DISPLAY DEVICE USING SEMICONDUCTOR LIGHT EMITTING DEVICE AND METHOD FOR MANUFACTURING THE SAME

CROSS-REFERENCE TO RELATED APPLICATIONS

This application claims the benefit of priority of Korean Patent Application No. 10-2015-0177301, filed on Dec. 11, 2015, which is herein expressly incorporated by reference in their entireties.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as a slow response time, difficult implementation of flexibility in case of LCDs, and there exist drawbacks such as short life span, poor yield as well as low flexibility in case of AMOLEDs.

Further, light emitting diodes (LEDs) are light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

The need of high resolution exists for a flexible display using the semiconductor light emitting device, and thus, the semiconductor light emitting devices should be arranged in fine pitch. However, this causes difficulty in electrical connection between a wiring electrode and a semiconductor light emitting device. For example, when a wiring electrode is electrically connected to a conductive electrode of the semiconductor light emitting device using an anisotropy conductive film (ACF), conductive balls are lost due to a small size or difficult alignment in case of fine pitch.

SUMMARY OF THE INVENTION

An aspect of the present disclosure is to improve a process margin in a wiring process of semiconductor light emitting devices.

Another aspect of the present disclosure is to implement a signal transfer path with higher reliability on a high-resolution and large-sized display.

A display device according to the present disclosure may include a substrate, a protrusion portion semiconductor light emitting devices, and an intermediate electrode. A wiring electrode may be formed on the substrate, and a plurality of semiconductor light emitting devices may be electrically connected to the wiring electrode. The intermediate electrode may be extended along one direction to be electrically connected to the conductive electrodes of adjoining semiconductor light emitting devices, respectively, to cover the conductive electrodes, and disposed to face the wiring electrode to be electrically connected to the wiring electrode.

Furthermore, according to the present disclosure, there is disclosed a fabrication method of a display device including sequentially growing a first conductive semiconductor layer, an active layer and a second conductive semiconductor layer on a substrate, forming a plurality of semiconductor light emitting devices on the substrate through etching, forming a conductive electrode on the first conductive semiconductor layer, coating an insulating material on the substrate to cover the semiconductor light emitting devices, removing part of the insulating material to expose the conductive electrode, forming an intermediate electrode electrically connected to the conductive electrodes of adjoining semiconductor light emitting devices, respectively, and electrically connecting the intermediate electrode to a wiring electrode on a wiring substrate.

In a display device according to the present disclosure, a contact area between a wiring electrode and semiconductor light emitting devices increases by an intermediate electrode. Thus, it is possible to improve a process margin during the wiring process of the semiconductor light emitting devices as well as implement an electrical connecting path with high reliability.

More specifically, a data line on a wiring substrate may be formed in a vertical direction to function as a first common electrode, and a second common electrode may be also formed in a vertical direction on independently provided semiconductor light emitting devices, respectively, and the first common electrode and second common electrode may be connected to each other using conductive balls, and accordingly, when one or more conductive balls are captured at any location between the common electrodes, it is possible to apply an electrical signal to all semiconductor light emitting devices in a vertical direction.

Thus, a bonding process margin may be allowed without opening even during the fabrication of high-resolution displays, and a fabrication margin and an bonding margin may coexist on the components in case of large-sized displays, thereby having an advantage capable of controlling a portion on which an open probability of the semiconductor light emitting devices increases.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
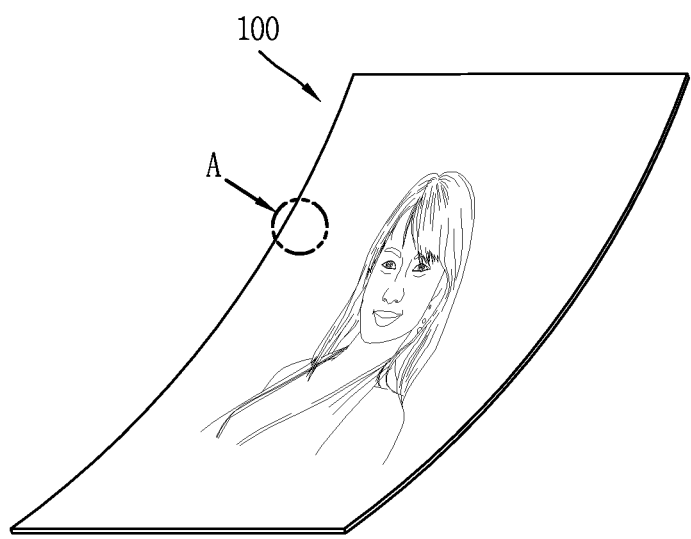
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the other element or an intermediate element may also be interposed therebetween. A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, a configuration disclosed herein may be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 may be displayed using a flexible display. The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration Thus.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
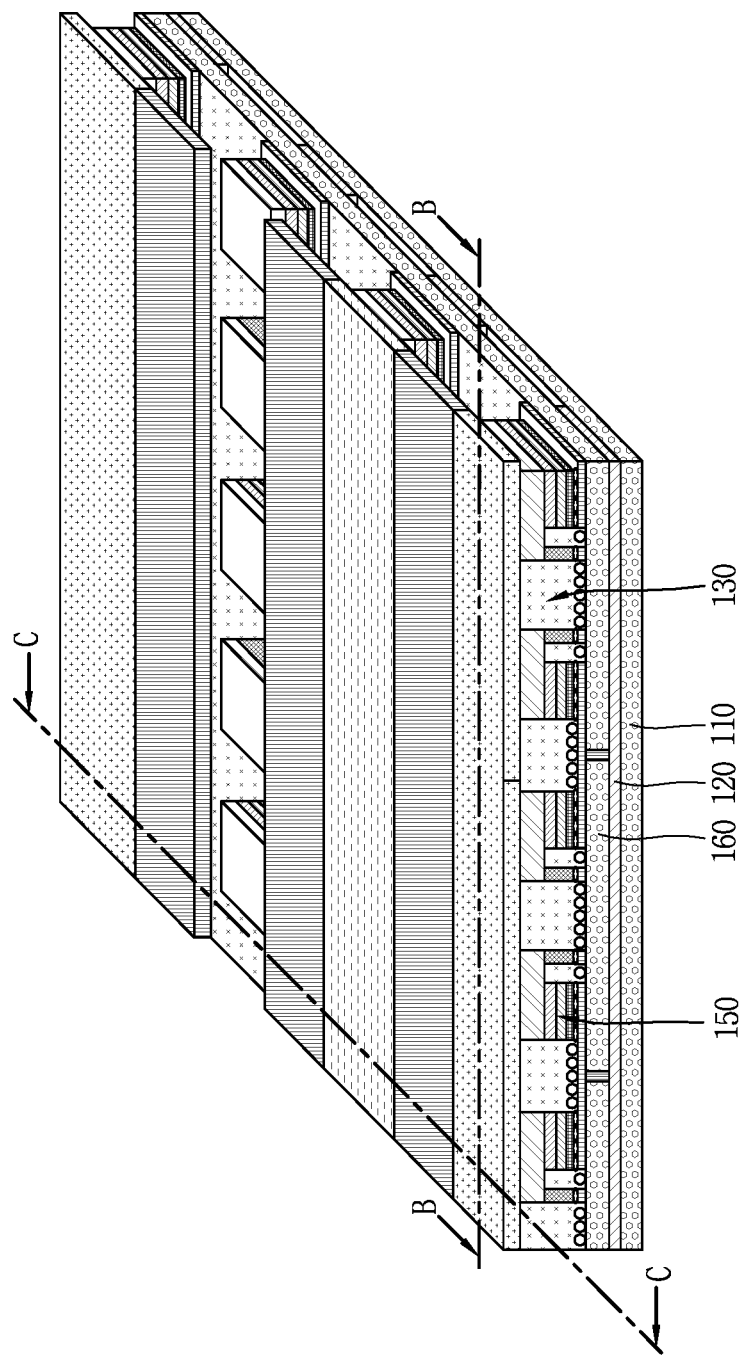
FIG. 2 is a partial enlarged view of portion "A" in FIG. 1, and FIGS. 3A and 3B are cross-sectional views taken along lines B-B and C-C in FIG. 2.
Figure 3A:
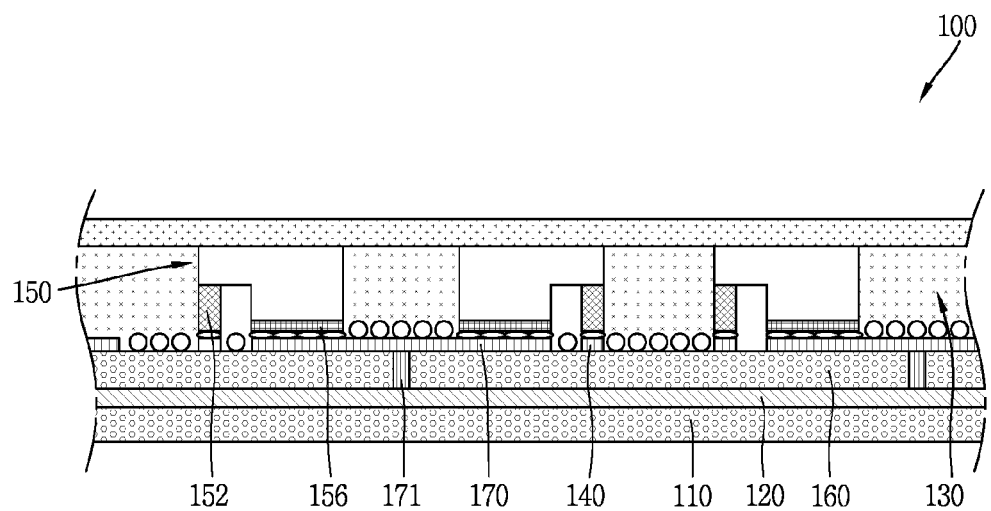
Figure 3B:
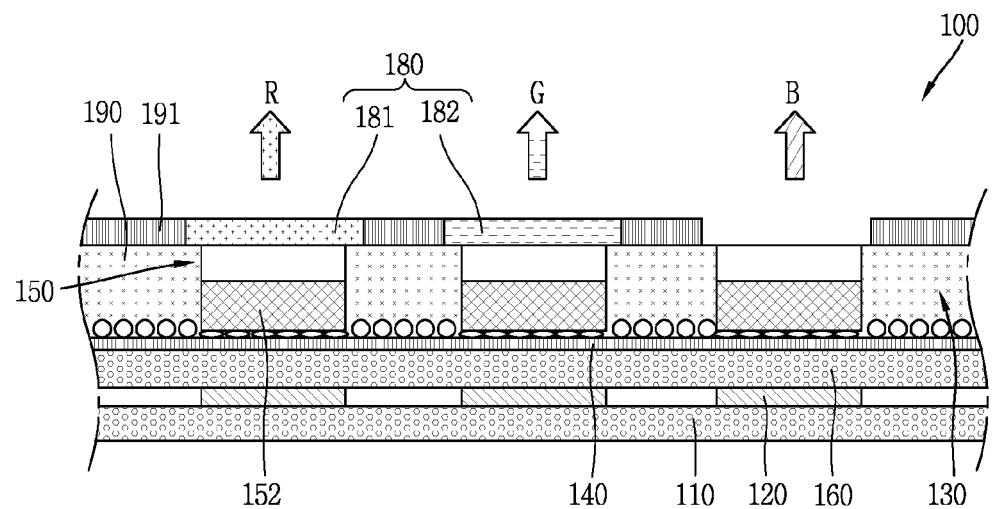
Figure 4:
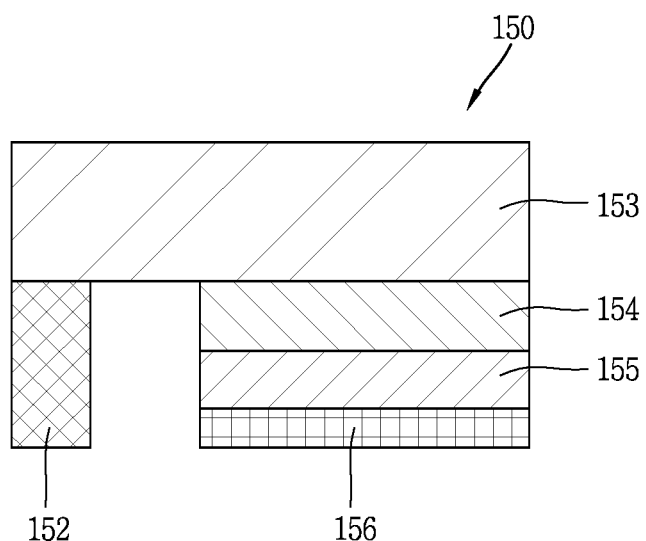
FIG. 4 is a conceptual view illustrating a flip-chip type semiconductor light emitting device in FIG. 3A.

As shown in FIGS. 2, 3A and 3B, there is illustrated a display device 100 using a passive matrix (PM) type semiconductor light emitting device as the display device 100 using a semiconductor light emitting device. However, the following illustration is also applicable to an active matrix (AM) type semiconductor light emitting device.

The display device 100 includes a substrate 110, a first electrode 120, a conductive adhesive layer 130, a second electrode 140, and a plurality of semiconductor light emitting devices 150. The substrate 110 may be a flexible substrate and contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials. The substrate 110 may be a wiring substrate disposed with the first electrode 120, and thus the first electrode 120 may be placed on the substrate 110.

An insulating layer 160 is disposed on the substrate 110 placed with the first electrode 120, and an auxiliary electrode 170 is placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to than single wiring substrate.

Further, the auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and can be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 performs the role of an insulating layer in the structure in which the conductive adhesive layer 130 is disposed on the substrate 110.

Further, the conductive adhesive layer 130 may have adhesiveness and conductivity, and a conductive material and an adhesive material can be mixed on the conductive adhesive layer 130. Furthermore, the conductive adhesive layer 130 may have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (hereinafter referred to as a "conductive adhesive layer").

In addition, the anisotropic conductive film includes an anisotropic conductive medium mixed with an insulating base member, and thus when heat and pressure are applied thereto, only a specific portion thereof has conductivity by the anisotropic conductive medium. Hereinafter, heat and pressure are applied to the anisotropic conductive film, but other methods are also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film includes an anisotropic conductive medium mixed with an insulating base member, and thus when heat and pressure are applied thereto, only a specific portion thereof has conductivity by the conductive balls. The anisotropic conductive film may include a core with a conductive material containing a plurality of particles coated by an insulating layer with a polymer material, and in this instance, has conductivity by the core while breaking an insulating layer on a portion to which heat and pressure are applied. Here, a core may be transformed to implement a layer having both surfaces to which objects contact in the thickness direction of the film.

In a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may contain a plurality of particles in which a conductive material is coated on insulating cores. In this instance, a portion to which heat and pressure are applied can be converted (pressed and adhered) to a conductive material to have conductivity in the thickness direction of the film. In still another example, the film is formed to have conductivity in the thickness direction of the film in which a conductive material passes through an insulating base member in the z-direction. In this instance, the conductive material may have a pointed end portion.

According to the drawing, the anisotropic conductive film is a fixed array anisotropic conductive film (ACF) including conductive balls inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film may include conductive balls randomly mixed with an insulating base member or a form configured with a plurality of layers in which conductive balls are disposed at any one layer (double-ACF), and the like. Further, the anisotropic conductive paste may be a paste in which conductive balls are mixed with an insulating and adhesive base material. Furthermore, a solution containing conductive particles may contain conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device 150 may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitutes a light-emitting array, and a phosphor layer 180 is formed on the light-emitting array. The light emitting device may include a plurality of semiconductor light emitting devices with different self luminance values. Each of the semiconductor light emitting devices 150 constitutes a sub-pixel, and is electrically connected to the first electrode 120. For example, a plurality of first electrodes 120, and the semiconductor light emitting devices are arranged in several rows, for instance, and each row of the semiconductor light emitting devices can be electrically connected to any one of the plurality of first electrodes.

Furthermore, the semiconductor light emitting devices may be connected in a flip chip form, and thus semiconductor light emitting devices grown on a transparent dielectric substrate. In addition, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 can be formed between the semiconductor light emitting devices 150. In this instance, the partition wall 190 divides individual sub-pixels from one another, and is formed as an integral body with the conductive adhesive layer 130. For example, a base member of the anisotropic conductive film may form the partition wall when the semiconductor light emitting device 150 is inserted into the anisotropic conductive film. Furthermore, when the base member of the anisotropic conductive film is black, the partition wall 190 has reflective characteristics while at the same time increasing contrast with no additional black insulator.

In another example, a reflective partition wall may be separately provided with the partition wall 190. In this instance, the partition wall 190 may include a black or white insulator according to the purpose of the display device. This has an effect of enhancing reflectivity when the partition wall of the while insulator is used, and increase contrast while at the same time having reflective characteristics.

Further, the phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
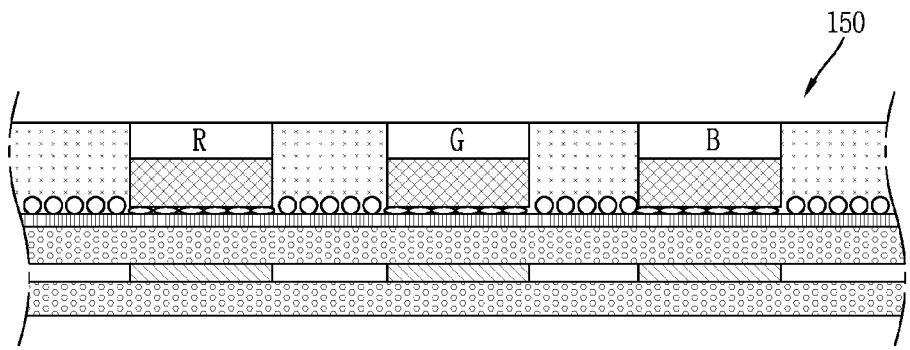
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
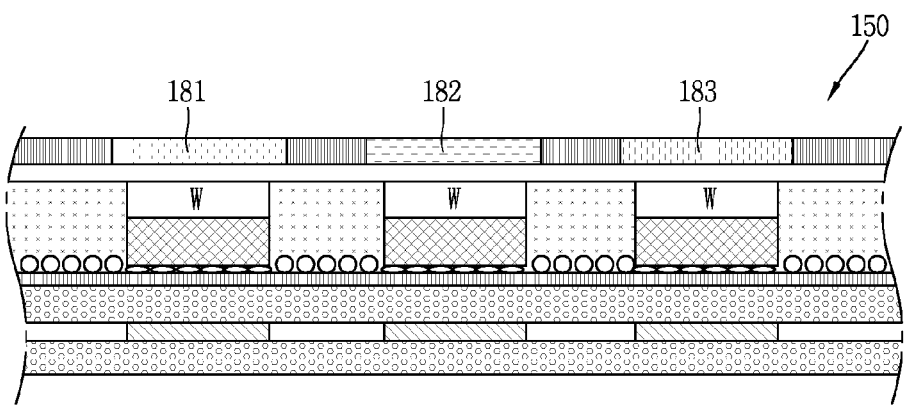

Referring to FIG. 5B, the semiconductor light emitting device 150 may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
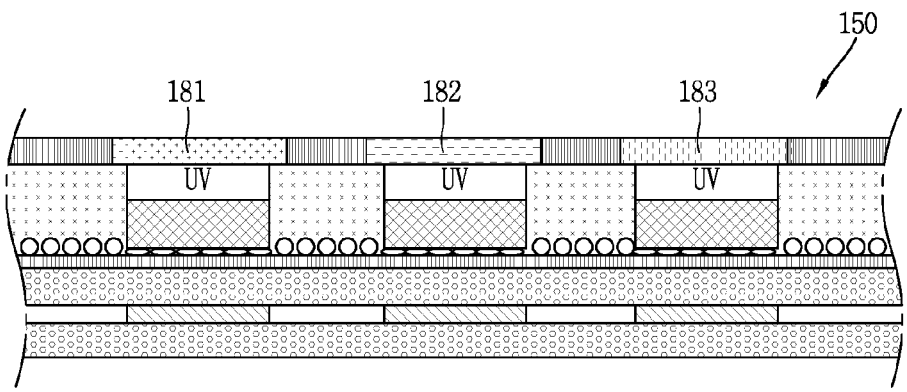

Referring to FIG. 5C, it is possible to also have a structure in which a red phosphor layer 181, a green phosphor layer 182 and blue phosphor layer 183 may be provided on a ultra violet light emitting device (UV). Thus, the semiconductor light emitting device 150 can be used over the entire region up to ultra violet (UV) as well as visible light, and can be extended in which ultra violet (UV) can be used as an excitation source.

Taking the present example into consideration again, the semiconductor light emitting device 150 is placed on the conductive adhesive layer 130 to configure a sub-pixel in the display device. Further, the semiconductor light emitting device 150 has excellent luminance characteristics, and thus it is possible to configure individual sub-pixels even with a small size thereof. The size of the individual semiconductor light emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting devices becomes sufficiently large. Accordingly, it is possible to implement a flexible display device having a HD image quality.

A display device using the foregoing semiconductor light emitting device is fabricated by a novel type of fabrication method. Hereinafter, the fabrication method will be described with reference to FIG. 6. In particular, FIG. 6 includes cross-sectional views illustrating a method of fabricating a display device using a semiconductor light emitting device according to an embodiment of the present disclosure.

Figure 6:
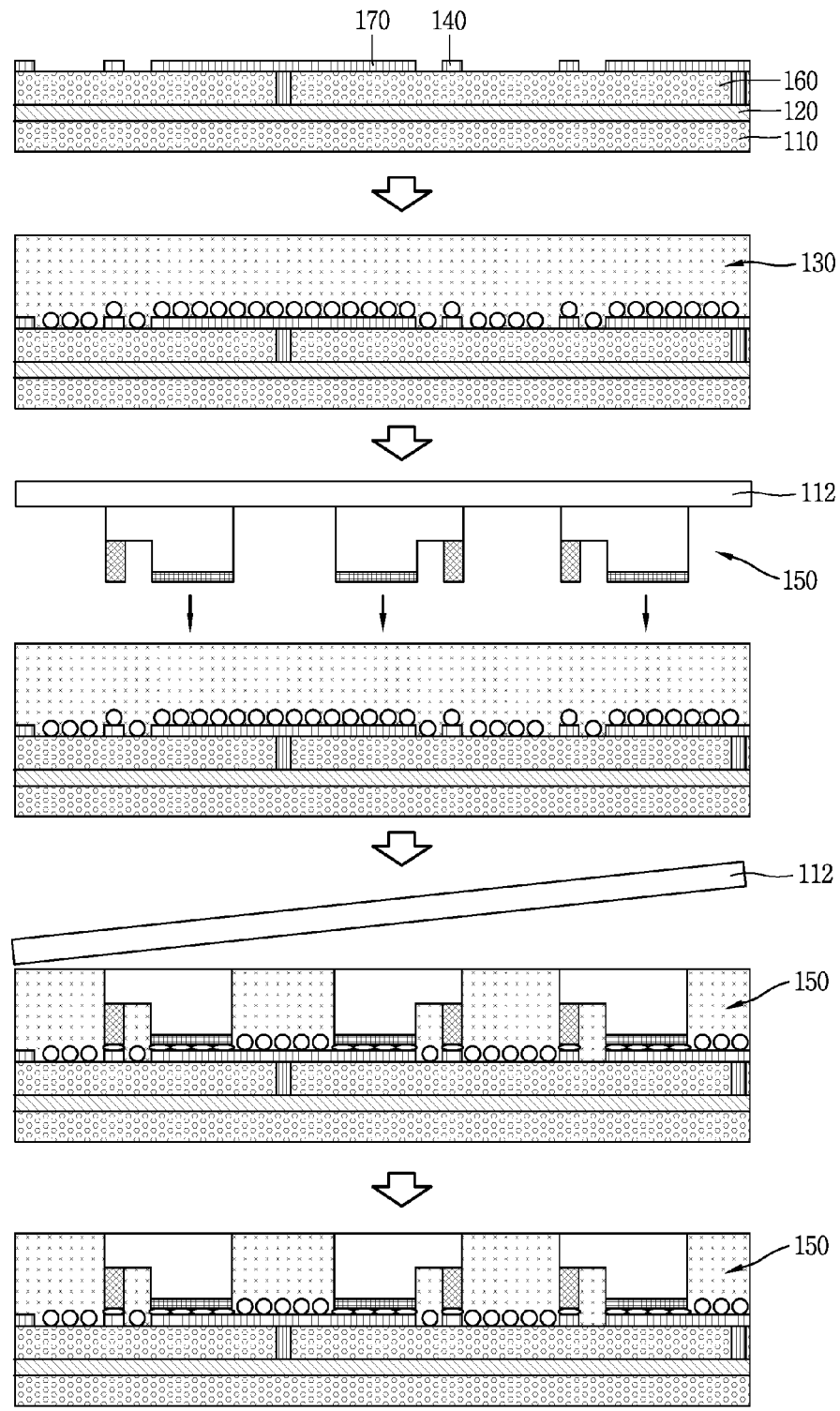
FIG. 6 is cross-sectional views illustrating a fabrication method of a display device using a semiconductor light emitting device according to the present disclosure.

Referring to FIG. 6, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate.

In this instance, the first electrode 120 and second electrode 140 may be disposed in a perpendicular direction to each other. Furthermore, the first substrate 110 and insulating layer 160 may contain glass or polyimide (PI), respectively, to implement a flexible display device. The conductive adhesive layer 130 may be implemented by an anisotropic conductive film, for example, and an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140. In this instance, the second substrate 112 as a growth substrate for growing the semiconductor light emitting device 150 may be a sapphire substrate or silicon substrate. The semiconductor light emitting device has a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 has conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

A phosphor layer can also be formed on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

Figure 7:
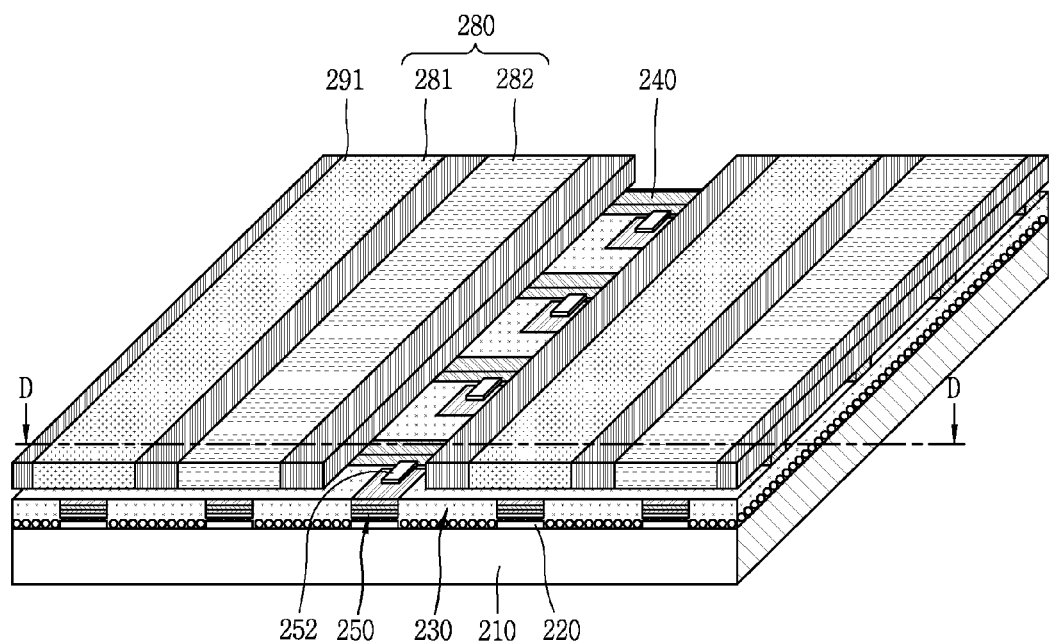
FIG. 7 is a perspective view illustrating a display device using a semiconductor light emitting device according to another embodiment of the present disclosure.
Figure 8:
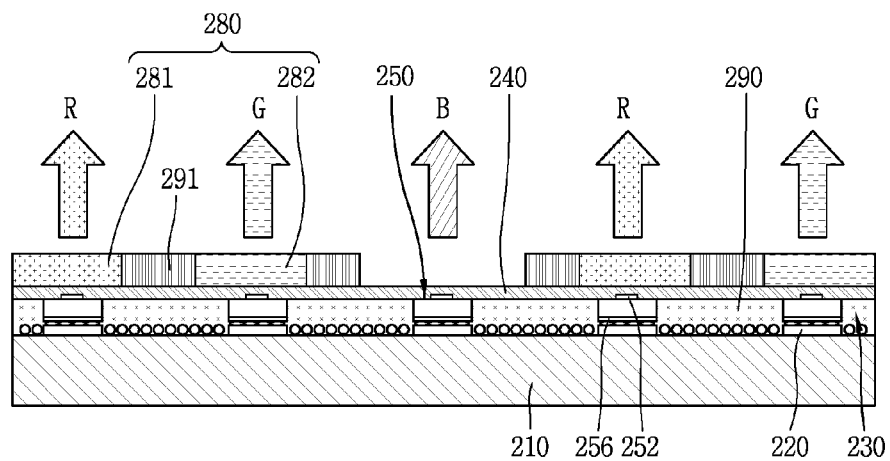
FIG. 8 is a cross-sectional view taken along line D-D in FIG. 7.
Figure 9:
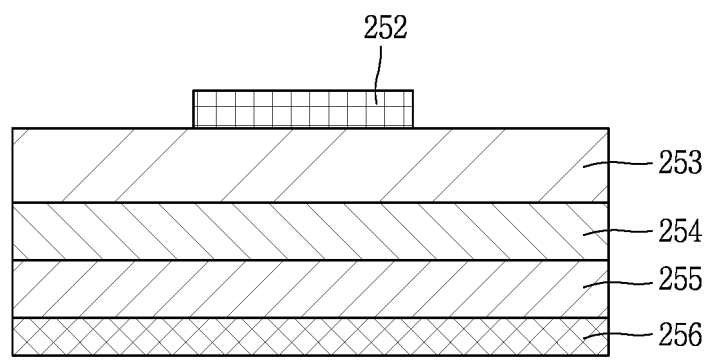
FIG. 9 is a conceptual view illustrating a vertical type semiconductor light emitting device in FIG. 8.

The fabrication method or structure of a display device using the foregoing semiconductor light emitting device may be modified in various forms. For example, the foregoing display device may be applicable to a vertical semiconductor light emitting device described with reference to FIGS. 5 and 6. Next, FIG. 7 is a perspective view illustrating a display device using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

As shown, the display device is using a passive matrix (PM) type of vertical semiconductor light emitting device. The display device includes a substrate 210, a first electrode 220, a conductive adhesive layer 230, a second electrode 240 and a plurality of semiconductor light emitting devices 250. Further, the substrate 210 as a wiring substrate disposed with the first electrode 220 may include polyimide (PI) to implement a flexible display device. In addition, any one may be used if it is an insulating and flexible material.

The first electrode 220 is located on the substrate 210, and formed with a bar-shaped electrode elongated in one direction. The first electrode 220 also performs the role of a data electrode. In addition, the conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates when the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 is preferably disposed on the first electrode 220.

Further, the electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof. Furthermore, the anisotropic conductive film contains an adhesive component, and thus the conductive adhesive layer 230 implements a mechanical coupling as well as an electrical coupling between the semiconductor light emitting device 250 and the first electrode 220.

Thus, the semiconductor light emitting device 250 is placed on the conductive adhesive layer 230, thereby configuring a separate sub-pixel in the display device. The semiconductor light emitting device 250 has excellent luminance characteristics, and thus it is possible to configure individual sub-pixels even with a small size thereof. Further, the size of the individual semiconductor light emitting device 250 may be less than 80 μm in the length of one side thereof, and formed with a rectangular or square shaped element. In case of a rectangular shaped element, the size thereof may be less than 20×80 μm.

In addition, the semiconductor light emitting device 250 may be a vertical structure. A plurality of second electrodes 240 disposed in a direction of crossing the length direction of the first electrode 220, and electrically connected to the vertical semiconductor light emitting device 250 are also located between vertical semiconductor light emitting devices.

Referring to FIG. 9, the vertical semiconductor light emitting device 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof can be electrically connected to the first electrode 220 by the conductive adhesive layer 230, and the n-type electrode 252 located at the top thereof can be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light emitting device is applied. Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Thus, the second electrode 240 may be electrically connected to the n-type electrode of the semiconductor light emitting device 250.

According to the drawing, the second electrode 240 is located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 can be located on the transparent insulating layer. Furthermore, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness can be used as a horizontal electrode without being restricted by the selection of a transparent material, thereby enhancing the light extraction efficiency.

According to the drawing, a partition wall 290 is formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 divides individual sub-pixels from one another, and is formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 has reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 can be located between the semiconductor light emitting device 250 and second electrode 240. Accordingly, individual sub-pixels can be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality. Furthermore, according to the drawing, a black matrix 291 is disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

In a display device using a semiconductor light emitting device according to the present disclosure as described above, it may be difficult to implement fine pitch since a first and a second electrode are arranged on the same plane when a flip chip type is applied thereto. Hereinafter, a display device to which a flip chip type semiconductor light emitting device according to another embodiment of the present disclosure capable of solving this problem is applied will be described in more detail.

Figure 10:
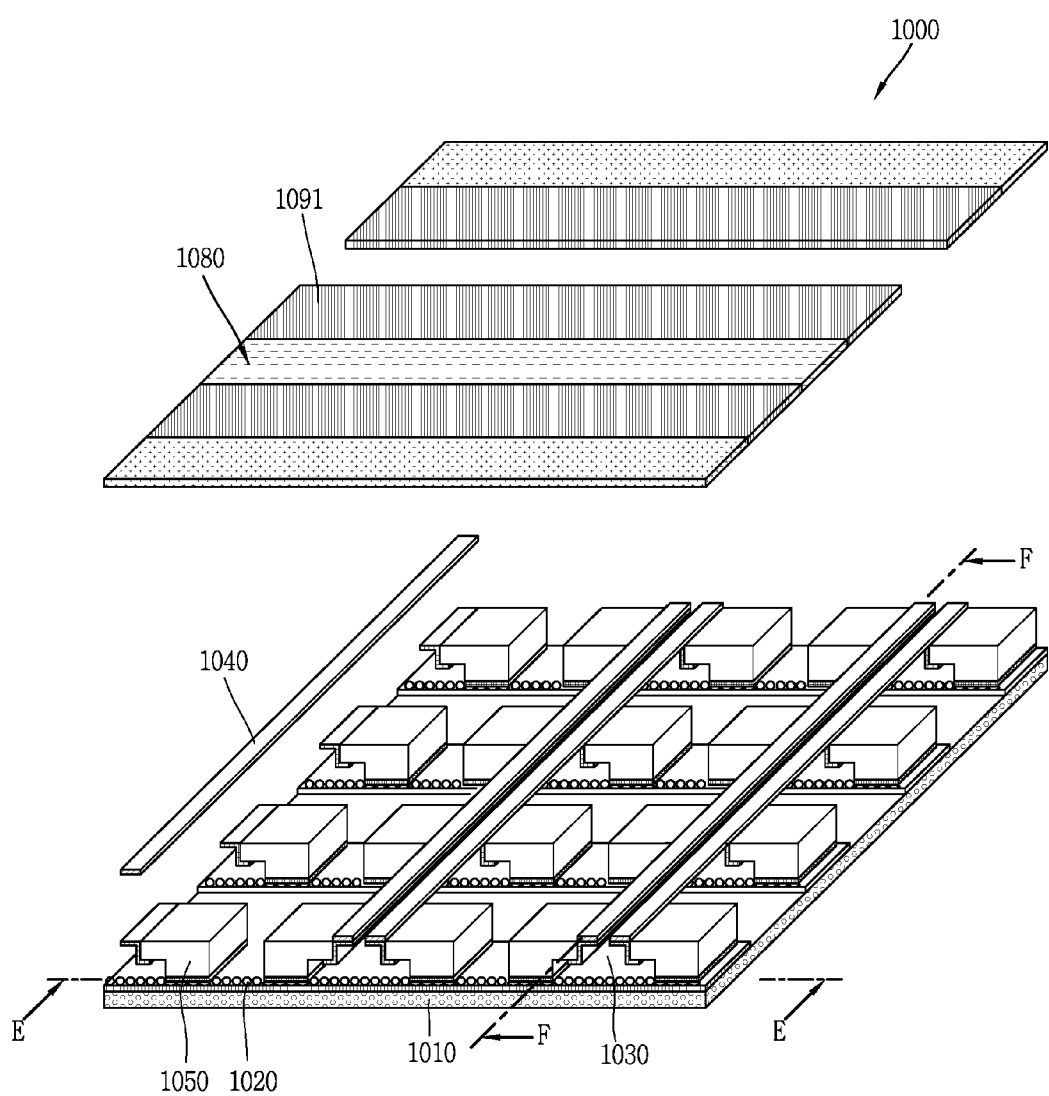
FIG. 10 is an enlarged view illustrating portion "A" in FIG. 1 illustrating another embodiment of the present disclosure to which a new type semiconductor light emitting device is applied.
Figure 11A:
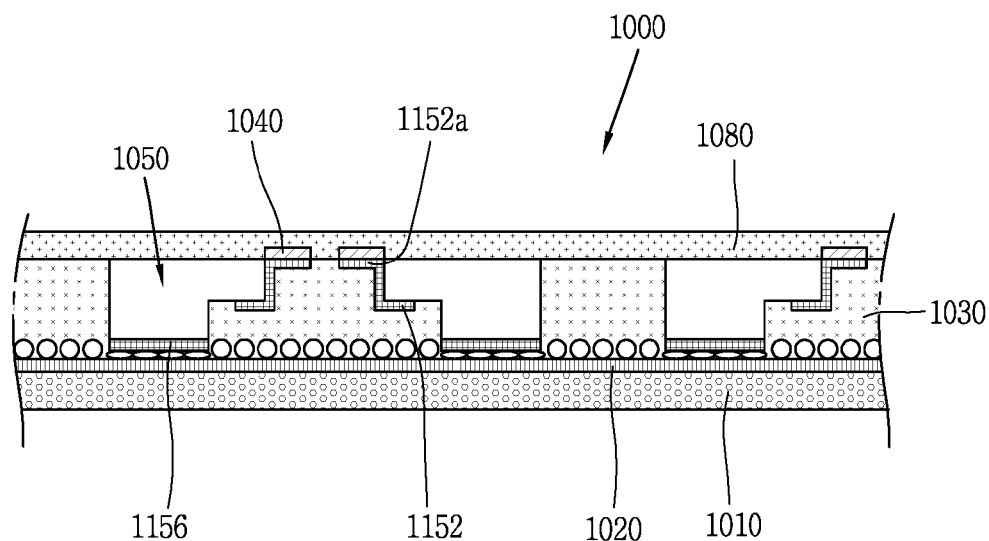
FIG. 11A is a cross-sectional view taken along line E-E in FIG. 10.
Figure 11B:
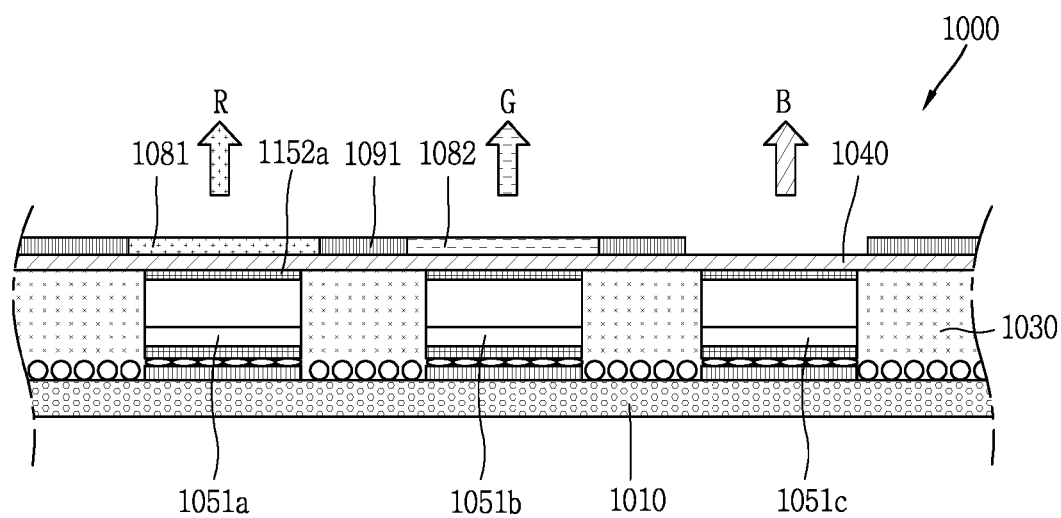
FIG. 11B is a cross-sectional view taken along line F-F in FIG. 10.
Figure 12:
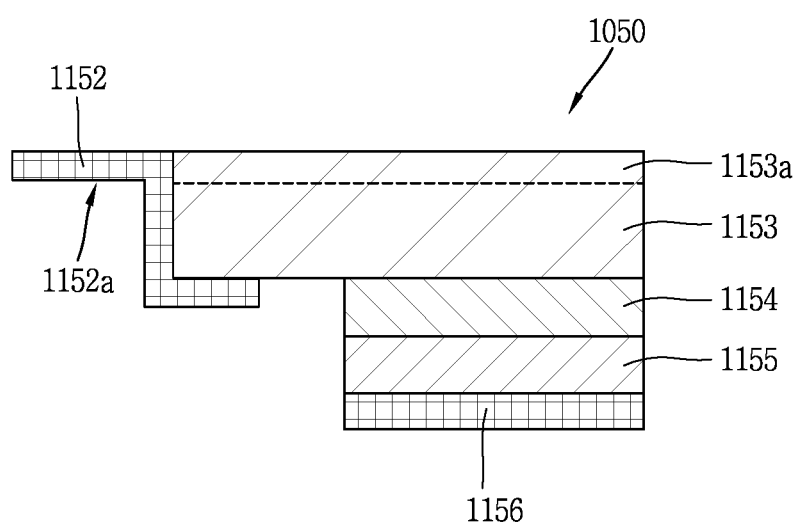
FIG. 12 is a conceptual view illustrating a flip chip type semiconductor light emitting device in FIG. 11A.

In particular, FIG. 10 is an enlarged view illustrating portion "A" in FIG. 1 illustrating another embodiment of the present disclosure to which a new type semiconductor light emitting device is applied, FIG. 11A is a cross-sectional view taken along line E-E in FIG. 10, FIG. 11B is a cross-sectional view taken along line F-F in FIG. 10, and FIG. 12 is a conceptual view illustrating a flip chip type semiconductor light emitting device in FIG. 11A.

FIGS. 10, 11A and 11B illustrate a display device 1000 using a passive matrix (PM) type semiconductor light emitting device as a display device 1000 using a semiconductor light emitting device. However, the following illustration may be also applicable to an active matrix (AM) type semiconductor light emitting device. As shown, the display device 1000 includes a substrate 1010, a first electrode 1020, a conductive adhesive layer 1030, a second electrode 1040, and a plurality of semiconductor light emitting devices 1050. Here, the first electrode 1020 and second electrode 1040 may include a plurality of electrode lines, respectively.

The substrate 1010 as a wiring substrate on which the first electrode 1020 is disposed may include polyimide (PI) to implement a flexible display device. In addition, any one may be used if it is an insulating and flexible material. The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which a flip chip type light emitting device is applied, the conductive adhesive layer 1030 may be an anisotropic conductive film (ACF), an anisotropic conductive paste, a solution containing conductive particles, and the like. However, the conductive adhesive layer 1030 may be replaced with an adhesive layer. For example, if the first electrode 1020 is formed integrally with a conductive electrode of the semiconductor light emitting device without being located on the substrate 1010, then the adhesive layer may not be required.

A plurality of second electrodes 1040 disposed in a direction of crossing the length direction of the first electrode 1020, and electrically connected to the semiconductor light emitting device 1050 may be located between the semiconductor light emitting devices. According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected thereto due to a contact with the semiconductor light emitting device 1050.

Due to the foregoing structure, the plurality of semiconductor light emitting devices 1050 are coupled to the conductive adhesive layer 1030, and electrically connected to the first electrode 1020 and second electrode 1040. According to circumstances, a transparent insulating layer containing silicon oxide (SiOx) may be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As illustrated in the drawing, the plurality of semiconductor light emitting devices 1050 form a plurality of columns in a direction in parallel to a plurality of electrode lines provided in the first electrode 1020. However, the present disclosure is not limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051a at a location implementing a red sub-pixel, and a green phosphor 1082 capable of converting blue light into green (G) light may be deposited on the blue semiconductor light emitting device 1051b at a location implementing a green sub-pixel.

Furthermore, only the blue semiconductor light emitting device 1051c may be solely used at a location implementing a blue sub-pixel. In this instance, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure is not limited to this, and the semiconductor light emitting device 1050 may be combined with a quantum dot (QD) instead of a phosphor to implement sub-pixels such as red (R), green (G) and blue (B).

The display device may further include a black matrix 1091 disposed between each phosphor to enhance the contrast of the phosphor layer 1080. The black matrix 1091 may be formed so a gap is made between phosphor dots, and a black material fills into the gap. Thus, the black matrix 1091 can enhance the contrast between light and shade while at the same time absorbing external light reflection. The black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices may be formed at both sides by interposing a space with no the phosphor layer therebetween (or interposing the blue semiconductor light emitting device 1051c therebetween).

Referring to the semiconductor light emitting device 1050 according to the present disclosure again, electrodes are disposed at the top/bottom, thereby having an advantage of reducing the chip size. However, the electrodes are disposed at both the top/bottom, but a semiconductor light emitting device according to the present disclosure may be a flip chip type light emitting device.

Referring to FIG. 12, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154 and a second conductive electrode 1152 formed on the second conductive semiconductor layer 1153.

More specifically, the first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and an n-type semiconductor layer, respectively. However, the present disclosure is not limited to this, and may also have an illustration in which the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this instance, the second conductive electrode may be disposed on one surface of the second conductive semiconductor layer 1153, and an undoped semiconductor layer 1153a may be formed on the other surface of the second conductive semiconductor layer 1153.

Referring to FIG. 12 along with FIGS. 10 through 11B, one surface of the second conductive semiconductor layer may be a surface closest to the wiring substrate, and the other surface of the second conductive semiconductor layer may be a surface farthest surface from the wiring substrate. Furthermore, the first conductive electrode 1156 and second conductive electrode 1152 are formed to have a height difference in the width direction and vertical direction (or thickness direction) at a separated position along the width direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 may be protruded along the width direction from a lateral surface of the second conductive semiconductor layer 1153 (or lateral surface of the undoped semiconductor layer 1153a).

Thus, since the second conductive electrode 1152 is protruded from the lateral surface, the second conductive electrode 1152 can be exposed to an upper side of the semiconductor light emitting device. Thus, the second conductive electrode 1152 is disposed at a position overlapping with the second electrode 1040 disposed at an upper side of the conductive adhesive layer 1030.

More specifically, the semiconductor light emitting device may include a protrusion portion 1152a extended from the second conductive electrode 1152, and protruded from a lateral surface of the plurality of semiconductor light emitting devices. Based on the protrusion portion 1152a, the first conductive electrode 1156 and second conductive electrode 1152 are disposed at a separated position along the protrusion direction of the protrusion portion 1152a, and formed to have a height difference from each other in a direction perpendicular to the protrusion direction.

Further, the protrusion portion 1152a is extended from one surface of the second conductive semiconductor layer 1153 to a lateral surface thereof, and extended to an upper surface of the second conductive semiconductor layer 1153, more particularly, the undoped semiconductor layer 1153a. The protrusion portion 1152a is protruded along the width direction from a lateral surface of the undoped semiconductor layer 1153a. Accordingly, the protrusion portion 1152a can be electrically connected to the second electrode 1040 at an opposite side to the first conductive electrode based on the second semiconductor layer.

The structure having the protrusion portion 1152a may be a structure in which advantages of the foregoing horizontal semiconductor light emitting device and vertical semiconductor light emitting device can be used. Meanwhile, fine grooves can be formed by roughing on an upper surface which is the farthest from the first conductive electrode 1156 on the undoped semiconductor layer 1153a.

Since the foregoing display device according to the present disclosure has a small-sized semiconductor light emitting device, loss may occur in electrical connection between a first conductive electrode and a first electrode of the wiring substrate by conductive balls. Such a problem is more severe problem in a fine pitch, high-resolution and large-sized display.

The present disclosure presents a mechanism for improving a process margin during the wiring process of semiconductor light emitting devices as well as implementing a signal transfer path with higher reliability in a high-resolution and large-sized flexible display. Hereinafter, a display device to which a new mechanism is applied and a fabrication method thereof will be described.

Figure 13:
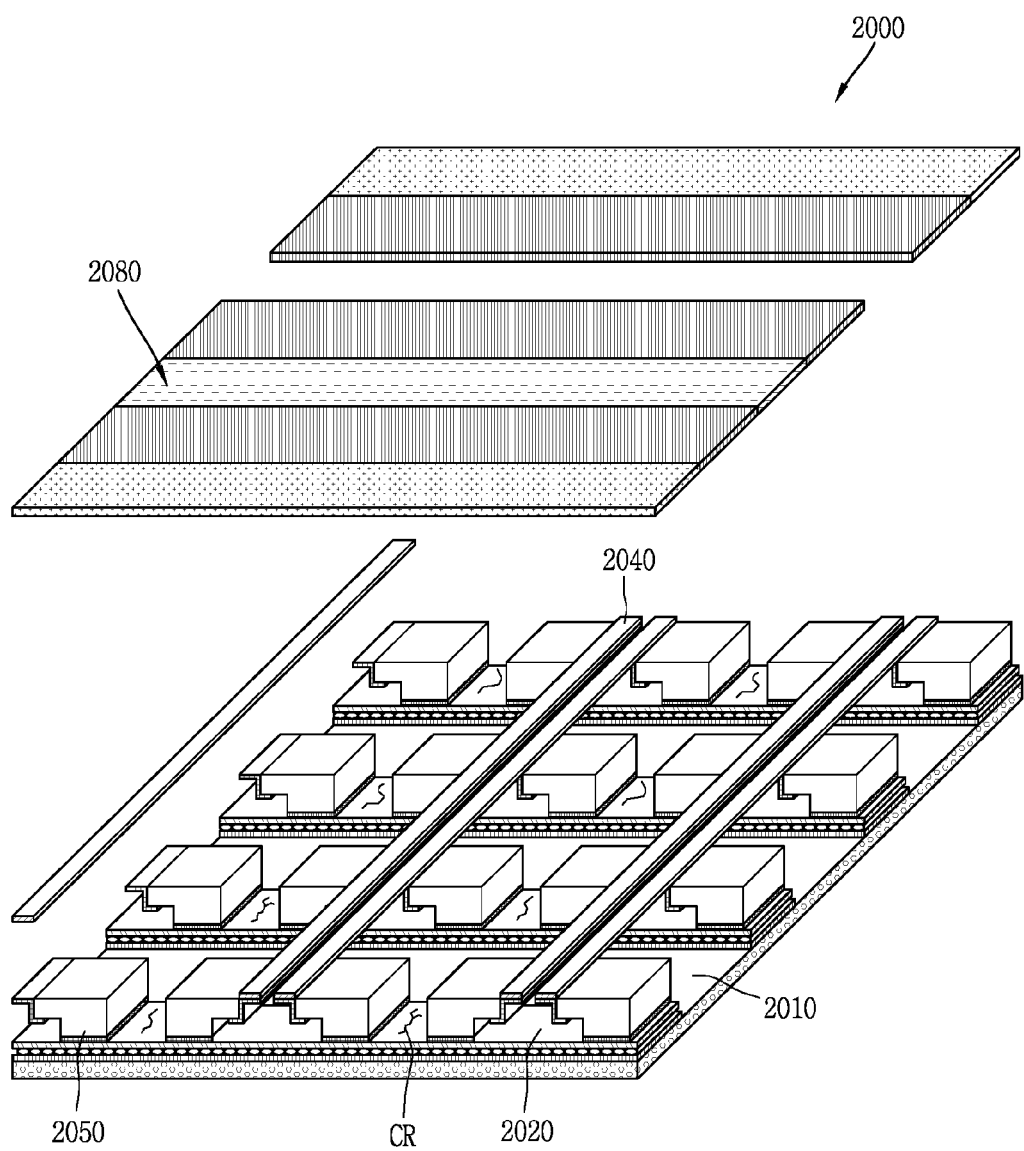
FIG. 13 is an enlarged view illustrating portion "A" in FIG. 1 illustrating another embodiment of the present disclosure.
Figure 14:
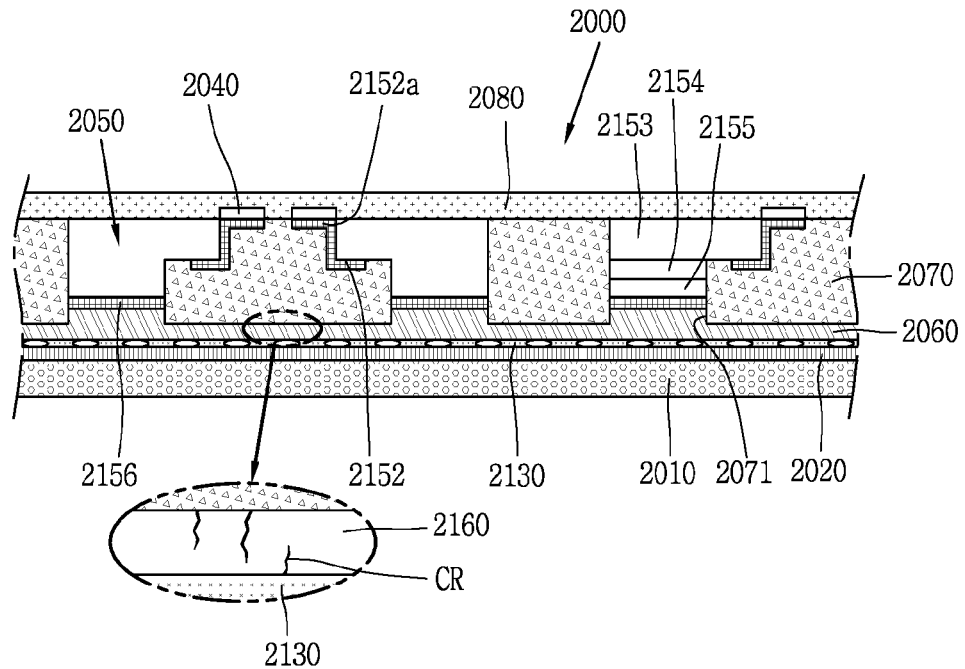
FIG. 14 is a cross-sectional view taken along line G-G in FIG. 13.
Figure 15:
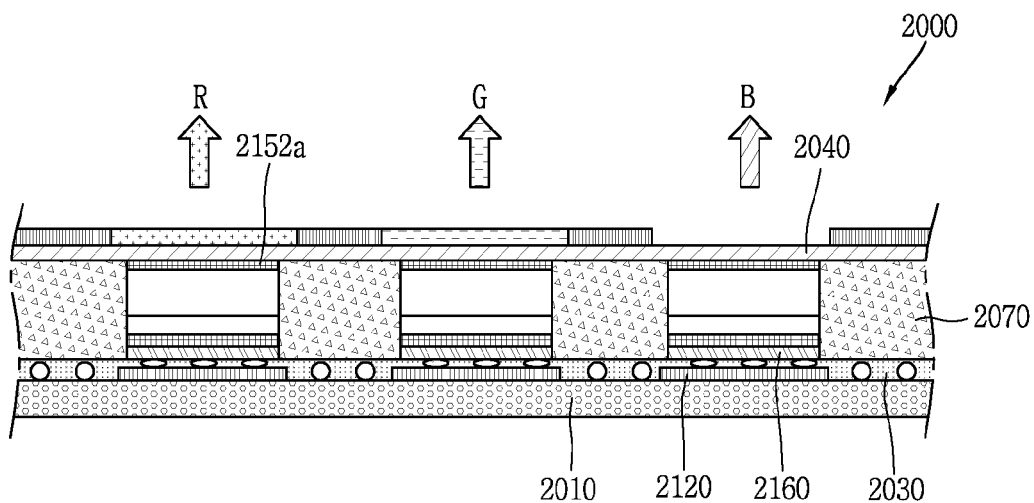
FIG. 15 is a cross-sectional view taken along line H-H in FIG. 13.
Figure 16:
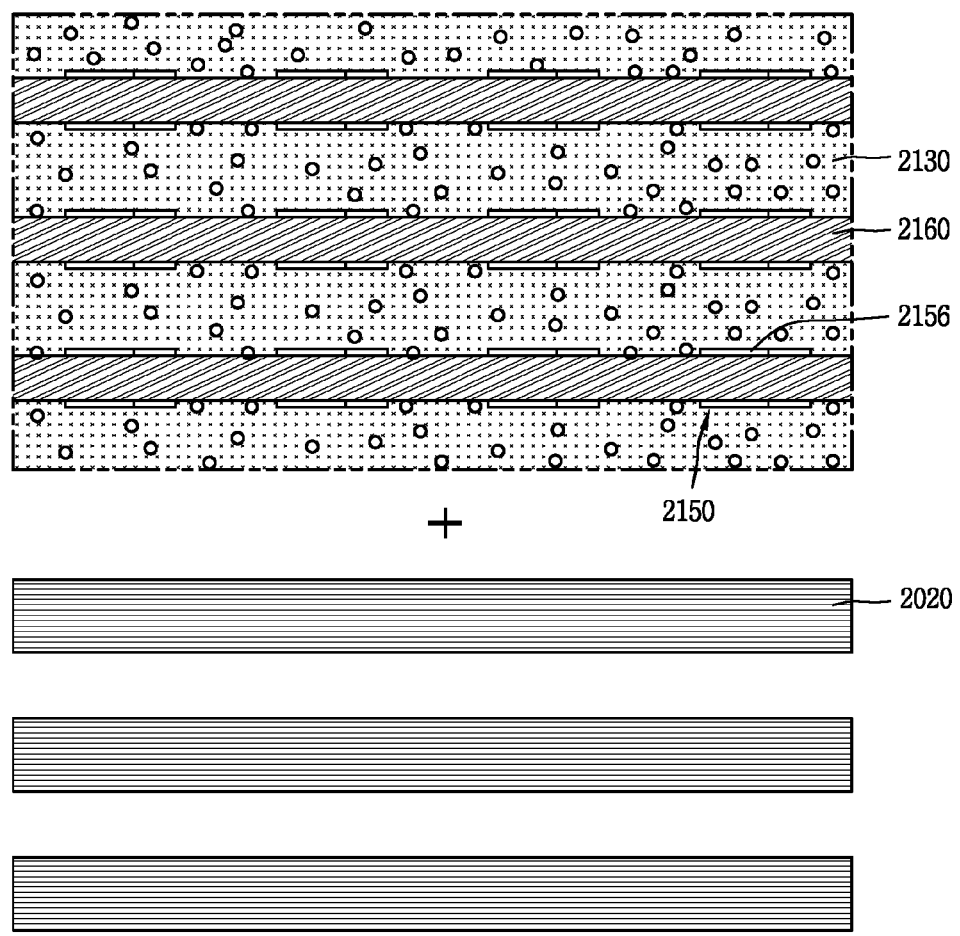
FIG. 16 is a conceptual view illustrating an electrode arrangement in FIG. 13, and FIGS. 17A and 17B are conceptual views illustrating a wiring state in a bonding state.
Figure 17A:
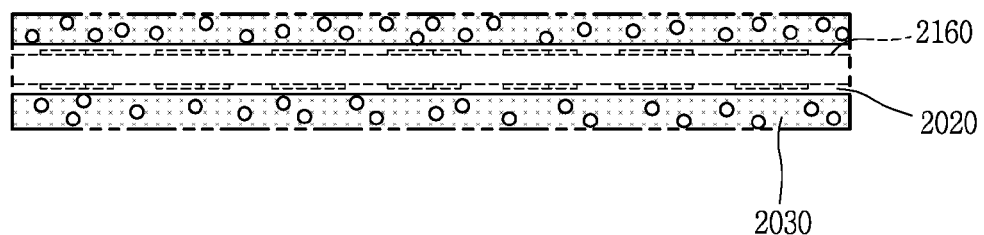
Figure 17B:
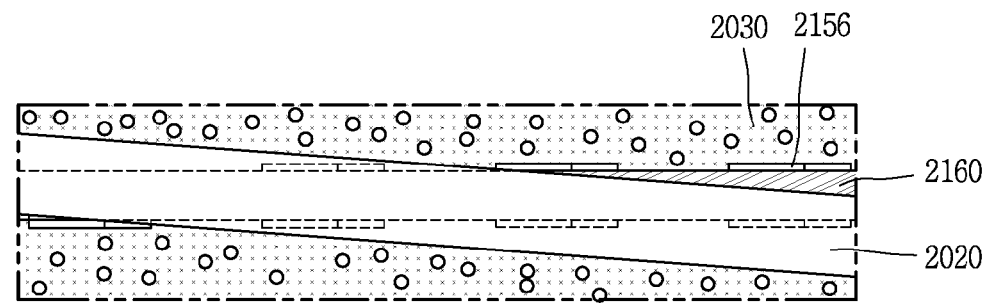

FIG. 13 is an enlarged view illustrating portion "A" in FIG. 1 illustrating another embodiment of the present disclosure, and FIG. 14 is a cross-sectional view taken along line G-G in FIG. 13, FIG. 15 is a cross-sectional view taken along line H-H in FIG. 13, FIG. 16 is a conceptual view illustrating an electrode arrangement in FIG. 13, and FIGS. 17A and 17B are conceptual views illustrating a wiring state in a bonding state.

FIGS. 13 to 17B illustrate a display device 2000 using a flip chip type semiconductor light emitting device described with reference to FIGS. 10 through 12. More specifically, a phosphor layer is applied to a flip chip type semiconductor light emitting device described with reference to FIGS. 10 through 12. However, an example which will be described below may be also applicable to a display device using the foregoing different type of semiconductor light emitting device.

According to the present example which will be described below, the same or similar reference numerals are designated to the same or similar configurations to each configuration of the foregoing example described with reference to FIGS. 10 through 12, and the description thereof will be substituted by the earlier description. For example, the display device 2000 may include a substrate 2010, a first electrode 2020, a conductive adhesive layer 2030, a second electrode 2040 and a plurality of semiconductor light emitting devices 2050, and the description thereof is substituted by the description with reference to FIGS. 10 through 12.

First, according to the present embodiment, as an example described with reference to FIGS. 10 through 12, the semiconductor light emitting device 2050 includes a first conductive electrode 2156, a first conductive semiconductor layer 2155 formed with the first conductive electrode 2156, an active layer 2154 formed on the first conductive semiconductor layer 2155, and a second conductive semiconductor layer 2153 formed on the active layer 2154 and a second conductive electrode 2152 formed on the second conductive semiconductor layer 2153.

More specifically, the first conductive electrode 2156 and first conductive semiconductor layer 2155 may be a p-type electrode and a p-type semiconductor layer, respectively, and the second conductive electrode 2152 and second conductive semiconductor layer 2153 may be an n-type electrode and an n-type semiconductor layer, respectively. However, the present disclosure is not limited to this, and may also have an illustration in which the first conductive type is an n-type and the second conductive type is a p-type.

Further, the substrate 2010 as a wiring substrate may include polyimide (PI) to implement a flexible display device, and a plurality of semiconductor light emitting devices may be adhered to the conductive adhesive layer 2030 disposed on the substrate 2010. The conductive adhesive layer 2030 may be an anisotropy conductive film (ACF), an anisotropy conductive paste, a conduction solution, or the like. According to the present embodiment, the conductive adhesive layer 2030 may be an anisotropy conductive film (ACF), and may include a plurality of anisotropic conductive media. Furthermore, the anisotropic conductive media may be conductive balls or conductive particles, for example.

The first electrode 2020 may be located on the substrate 1010, and perform the role of a data electrode having a bar elongated in one direction, and may be a wiring electrode electrically connected to the first conductive electrode 2156 of the plurality of semiconductor light emitting devices. The second electrode 2040 may be located on the conductive adhesive layer 2030, and electrically connected to the second conductive electrode 2152 of the semiconductor light emitting device to perform the role of a scan electrode.

More specifically, the semiconductor light emitting device may be extended from the second conductive electrode 2152, and include a protrusion portion 2152a protruded from a lateral surface of the plurality of semiconductor light emitting devices, and the protrusion portion 2152a may be electrically connected to the second electrode 2040 at an opposite side of the first conductive electrode 2156 based on the second conductive semiconductor layer 2153.

In this instance, the second electrode as a printing electrode may be printed on the conductive adhesive layer 2030 to be brought into contact with the second conductive electrodes of adjoining semiconductor light emitting devices, respectively, and may be electrically connected to the second conductive electrodes. Moreover, the display device 2000 may further include a phosphor layer 2080 formed on one surface of a plurality of semiconductor light emitting devices 2050. The description thereof will be substituted by the description of a phosphor layer described with reference to FIGS. 10, 11A and 11B.

According to the drawing of FIG. 16, the intermediate electrode 2160 is electrically connected to the first electrode 2020 and the first conductive electrode 2156 of the semiconductor light emitting devices, respectively. For example, the intermediate electrode 2160 may be extended along one direction to be electrically connected to the conductive electrodes (specifically, first conductive electrodes 2156) of adjoining semiconductor light emitting devices, respectively, to cover the conductive electrodes 2156 together, and disposed to face the first electrode 2020 to be electrically connected to the wiring electrode (specifically, first electrode 2020).

Referring to FIGS. 13 to 16, the intermediate electrode 2160 can be directly brought into contact with the first conductive electrodes 2156 to be electrically connected thereto. On the contrary, as the intermediate electrode 2160 is brought into contact with the anisotropic conductive media of the conductive adhesive layer 2030, and the anisotropic conductive media is brought into contact with the first electrode 2020, the intermediate electrode 2160 is electrically connected to the first electrode 2020.

Further, the first conductive electrodes 2156 of the adjoining semiconductor light emitting devices may be separated from each other, but the intermediate electrode 2160 may be electrically connected to the first conductive electrodes 2156, respectively, as an insulating layer 2170 is formed on the separation space. More specifically, the plurality of semiconductor light emitting devices are disposed at predetermined distances, and the insulating layer 2170 is configured to cover the plurality of semiconductor light emitting devices, and includes an insulating material filled between the plurality of semiconductor light emitting devices.

The insulating material may be formed of a flexible material to allow the flexure or bending of a display of displaying visual information using the plurality of semiconductor light emitting devices. Furthermore, the insulating material may be an adhesive layer having an adhesiveness to facilitate a connection to the wiring substrate. The insulating material may be an optical adhesive film such as an optical clear adhesive (OCA), an optical clear resin (OCR), and the like, for example. Thus, the insulating layer may be an adhesive insulating layer.

As illustrated in the drawing, the intermediate electrode 2160 is extended on one surface of the insulating material, and electrically connected to the conductive electrodes of the adjoining semiconductor light emitting devices. More specifically, the intermediate electrode 2160 may be a conductive thin film deposited on an upper surface which is the farthest from the second conductive semiconductor layer 2153 on the insulating layer 2170. Through holes 2171 (FIG. 18E) are formed on the insulating layer 2170 at positions corresponding to the first conductive electrodes to allow the conductive thin film to be directly brought into contact with the conductive electrodes.

The through holes 2171 may be disposed to be separated from each other at predetermined distances as the first conductive electrodes. Thus, an electrical connection structure in which a thin film deposited on the insulating layer 2170 for covering the semiconductor light emitting device is connected to the conductive electrodes on each line may be implemented by forming the through holes 2171 on the insulating layer 2170 to allow the intermediate electrode 2160 to be brought into contact with the conductive electrodes.

Further, the second electrode 2040 may be electrically connected to the protrusion portion 2152a of the second conductive electrode 2152 at an opposite side to the first conductive electrode 2156 based on the second conductive semiconductor layer 2153, similarly to the foregoing embodiment illustrated in FIGS. 10 through 13.

In this instance, the first electrode 2020 (wiring electrode) may be a data line for transmitting a data signal, and the second electrode 2040 may be a scan line connected to the second conductive electrodes to transmit a scan signal. The intermediate electrode 2160 may be a thin film electrode formed by deposition, and the scan line may be formed as a printing electrode, and the intermediate electrode 2160 may be formed to cross perpendicular to the scan line. However, the present disclosure is not limited to this, and when the first electrode is a scan line, and the second electrode is a data line is also allowed.

Here, the intermediate electrode 2160 may include a plurality of lines, and the plurality of lines may be driven as a common electrode of the first conductive electrodes, respectively, disposed along the relevant line. Further, as described above, a plurality of anisotropic conductive media provided on the conductive adhesive layer may be electrically connected to the intermediate electrode, and in this instance, any part of the anisotropic conductive media may be connected to the intermediate electrode and the first electrode, respectively, at positions overlapping with the first conductive electrodes.

Moreover, another part of the anisotropic conductive media may be connected to the intermediate electrode and the first electrode, respectively, at positions not overlapping with the conductive electrodes. Through such a structure, the intermediate electrode and first electrode may be electrically connected to each other through a bypass path. In this instance, as illustrated in detail in FIGS. 17A and 17B, a width of the first electrode 2020 may be formed to be larger than that of the intermediate electrode 2160.

Thus, even though a capture rate of anisotropic conductive media is reduced, a p-electrode is formed in a vertical direction as a common electrode of the thin film on each line, and thus an electrical connection to the semiconductor light emitting device for each vertical line bound in common is allowed. For example, as illustrated in FIG. 17A, it is possible to implement a structure in which there is no problem in electrical connection even though a number of anisotropic conductive media is small or they are lost at positions on which the intermediate electrode overlaps with the first conductive electrodes. In high-resolution displays, a number of anisotropic conductive media captured by the light emitting device stochastically decrease as a size of the light emitting device decreases, but according to a mechanism of the present disclosure, an electrical connection with high reliability is allowed even in this case.

In another example, as illustrated in FIG. 17B, the intermediate electrode and the first electrode may be electrically connected to each other by the anisotropic conductive media in a state of not being aligned in parallel. As illustrated in the drawing, a number of anisotropic conductive media captured by the light emitting device may stochastically decrease since a fabrication error or bonding error between components increases in case of a larger size. However, as the intermediate electrode is provided thereon as in the present disclosure, an electrical connection with high reliability is allowed even in such a case.

Further, referring to FIGS. 13 to 15, a plurality of cracks may be formed on the intermediate electrode. The cracks (CRs) may be created by the bending of the display device. At least one of the cracks (CRs) may be located between the conductive electrodes of the adjoining semiconductor light emitting devices. Thus, even though the intermediate electrode has a plurality of cracks (CRs), they are created due to a flexible function, and their electrical connections are not completely disconnected, and thus they does not affect on a function of forming electrical connections as a common electrode.

According to the foregoing structure of display device, a first common electrode configured with a first electrode and a second common electrode configured with an intermediate electrode may be connected using anisotropic conductive media, and when one or more of the anisotropic conductive media are captured at any position between the common electrodes, it is possible to apply an electrical signal to all semiconductor light emitting devices in a vertical direction.

Figure 18A:
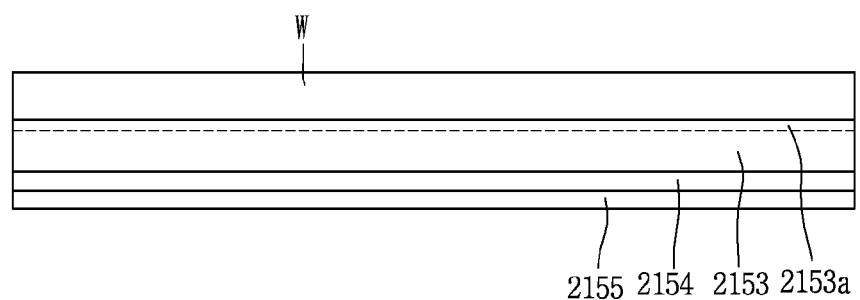
FIGS. 18A to 19C are cross-sectional views illustrating a fabrication method of a display device using a semiconductor light emitting device according to the present disclosure.

Hereinafter, a method of fabricating the foregoing new structure of display device will be described in more detail. FIGS. 18A to 19C are cross-sectional views illustrating a fabrication method of a display device using a semiconductor light emitting device according to the present disclosure. First, according to the fabrication method, the second conductive semiconductor layer 2153, active layer 2154, and first conductive semiconductor layer 2155, respectively, are grown on a growth substrate (W) (or semiconductor wafer) (FIG. 18A).

When the second conductive semiconductor layer 2153 is grown, the active layer 2154 is then grown on the second conductive electrode 2152, and then the first conductive semiconductor layer 2155 is grown on the active layer 2154. Thus, when the second conductive semiconductor layer 2153, active layer 2154 and first conductive semiconductor layer 2155 are sequentially grown, as illustrated in the drawing, the second conductive semiconductor layer 2153, active layer 2154 and first conductive semiconductor layer 2155 form a layered structure. The second conductive semiconductor layer 2153 may be a nitride semiconductor layer such as n-GaN as an n-type semiconductor layer.

In this instance, an undoped semiconductor layer 2153a overlapping with the second conductive semiconductor layer 2153 may be grown prior to growing the second conductive semiconductor layer 2153. The growth substrate (W) may be formed of a material having light transmitting properties such as any one of sapphire ($Al_2O_3$), GaN, ZnO and AlO, but is not limited to this. Furthermore, the growth substrate (W) may be formed of a material suitable to semiconductor material growth, carrier wafer. The growth substrate may be formed of a material having a high thermal conductivity, and use a SiC substrate having a thermal conductivity higher than that of the sapphire substrate ($Al_2O_3$) or at least one of Si, GaAs, GaP, InP and $Ga_2O_3$ including a conductive substrate or insulating substrate.

Next, the process of forming a plurality of semiconductor light emitting devices on the substrate through etching and the process of forming a conductive electrode on the first conductive semiconductor layer may be performed. For example, an etching process of separating a p-type semiconductor and an n-type semiconductor, and forming a plurality of semiconductor light emitting devices isolated from one another on the substrate is performed. In other words, the first conductive semiconductor layer 2155, active layer 2154 and second conductive semiconductor layer 2153 are etched to isolate semiconductor light emitting devices on the substrate.

Figure 18B:
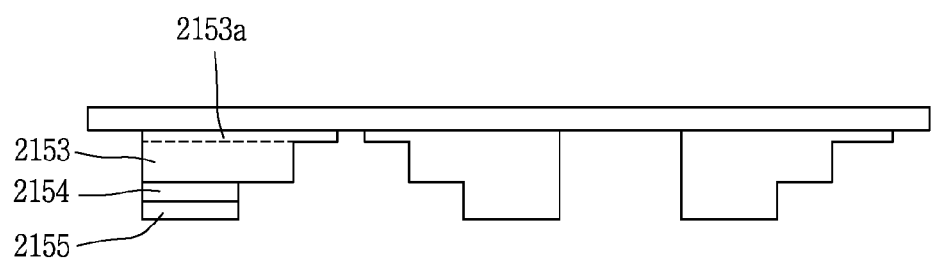

Referring to FIG. 18B, at least part of the first conductive semiconductor layer 2155, active layer 2154 and second conductive semiconductor layer 2153 are etched to form a plurality of semiconductor light emitting devices isolated from one another on the substrate. In this instance, the etching may be performed until when the substrate is emerged. In another example, the etching may be performed up to a state in which part of the second conductive semiconductor layer 2153 is remained between the semiconductor light emitting devices.

Figure 18C:
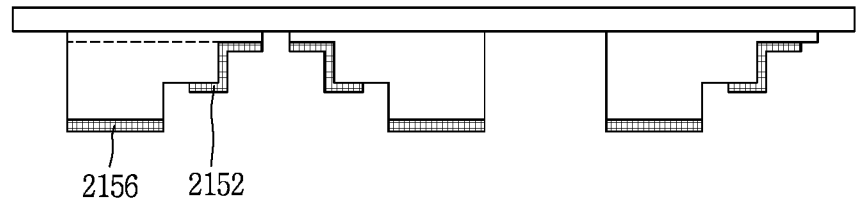

Next, at least one conductive electrode is formed on the semiconductor light emitting devices (FIG. 18C). More specifically, the first conductive electrode 2156 is formed on one surface of the first conductive semiconductor layer 2155. In other words, an array of semiconductor light emitting devices is formed on the substrate, and then the first conductive electrode 2156 is deposited on the first conductive semiconductor layer 2155. In this instance, the second conductive electrode 2152 may be deposited on the second conductive semiconductor layer 2153.

Figure 18D:
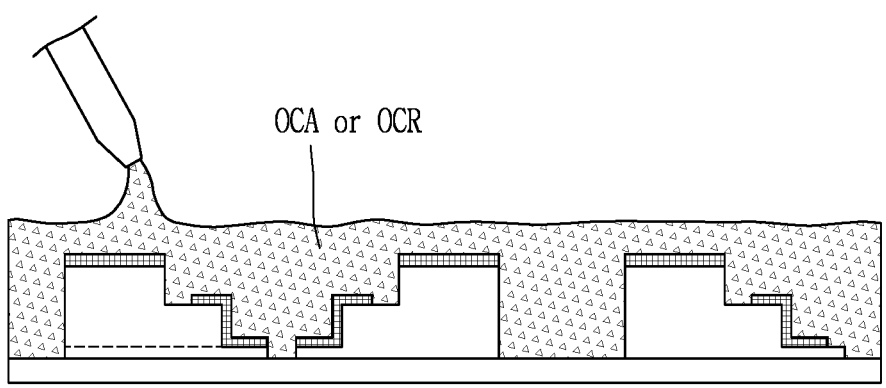

Then, the process of coating an insulating material on the growth substrate to cover the semiconductor light emitting devices is performed (FIG. 18D). An insulating layer 2170 may be formed by the coating of the insulating material. The insulating material may be an adhesive insulating layer.

The insulating material may be formed of a flexible material to allow the flexure or bending of a display of displaying visual information using the plurality of semiconductor light emitting devices. Furthermore, the insulating material may be an adhesive layer having an adhesiveness to facilitate a connection to the wiring substrate. The insulating material may be an optical adhesive film such as an optical clear adhesive (OCA), an optical clear resin (OCR), and the like, for example. Thus, the insulating layer may be an adhesive insulating layer.

Figure 18E:
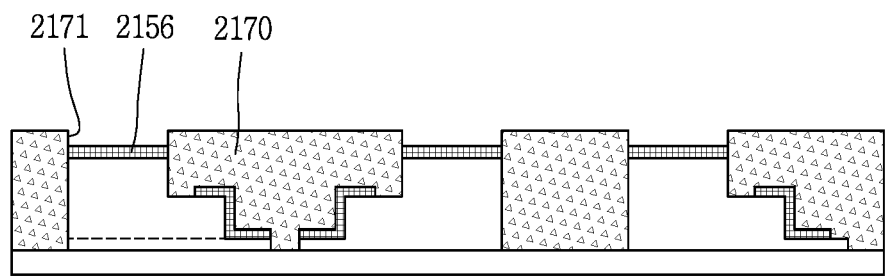
Figure 18F:
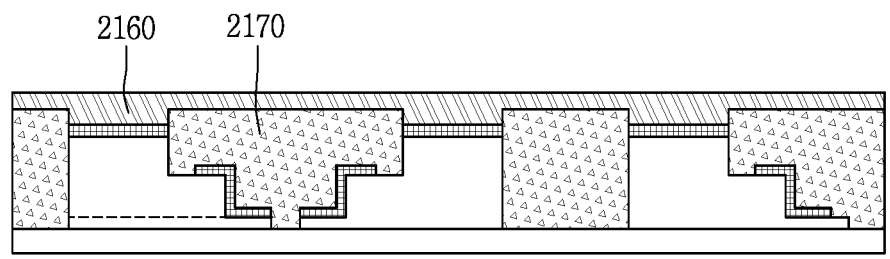

Next, part of the insulating material is removed to expose the first conductive electrode (FIG. 18E). In this instance, a portion corresponding to the first conductive electrode 2156 may be removed from the insulating layer 2170 by exposure, etching or the like to expose the first conductive electrode 2156 to an outside.

Then, the process of forming an intermediate electrode electrically connected to the conductive electrodes of the adjoining semiconductor light emitting devices, respectively (FIG. 18F), may be performed. The intermediate electrode 2160 may include a conductive thin film deposited on one surface of the insulating material and electrically connected to the conductive electrodes. For example, the insulating material may be formed when a metal thin film is deposited on a lower surface (the farthest surface from the second conductive semiconductor layer).

In this instance, the insulating material may be configured as part of a data line for transmitting a data signal, and the structure of the embodiment described with reference to FIGS. 13 through 17B will be all applicable to the detailed structure thereof. Moreover, the structure of an intermediate electrode in FIGS. 20 and 21 which will be described later will be also applicable to the present fabrication method.

Then, the process of electrically connecting the intermediate electrode to a wiring electrode on a wiring substrate, and separating the semiconductor light emitting devices from the substrate using a laser beam, and connecting the second conductive electrode to a second electrode may be performed.

Figure 19A:
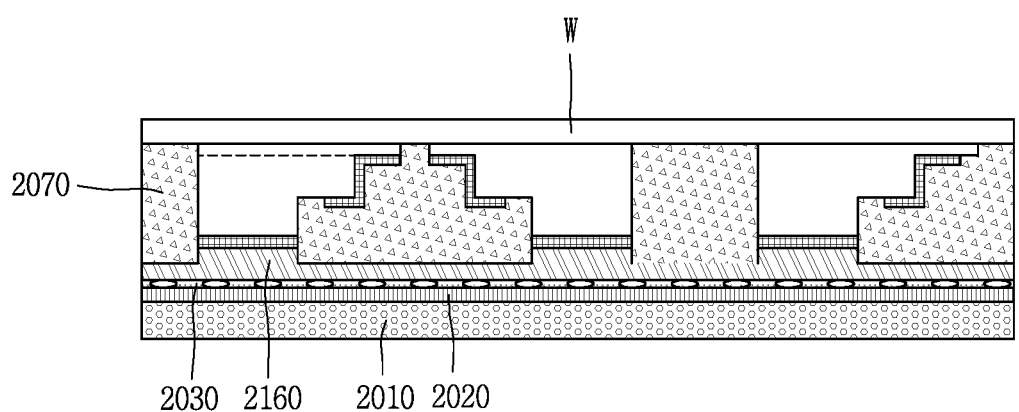
Figure 19B:
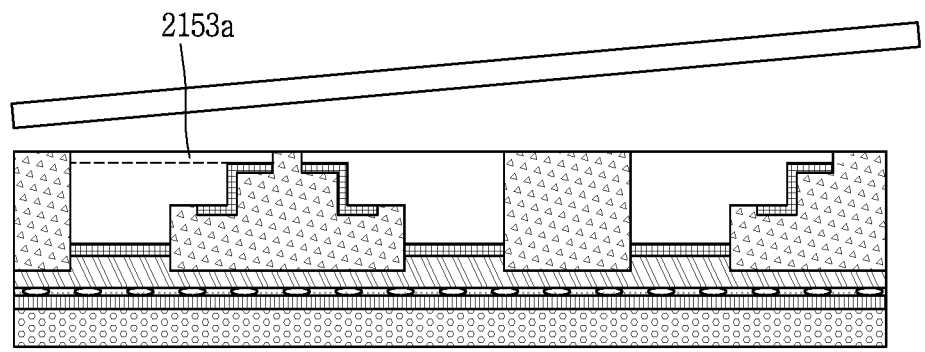

For example, the semiconductor light emitting devices are coupled to the wiring substrate using the conductive adhesive layer (FIG. 19A), and the growth substrate is removed (FIG. 19B). The wiring substrate is in a state of being connected to the first electrode 2020, and the first electrode 2020 is electrically connected to the intermediate electrode 2160 by a plurality of anisotropic conductive media within the conductive adhesive layer 2030 as lower wiring. The growth substrate may be removed using a laser lift-off (LLO) or chemical lift-off (CLO) method, and the semiconductor light emitting device is separated from the substrate.

Figure 19C:
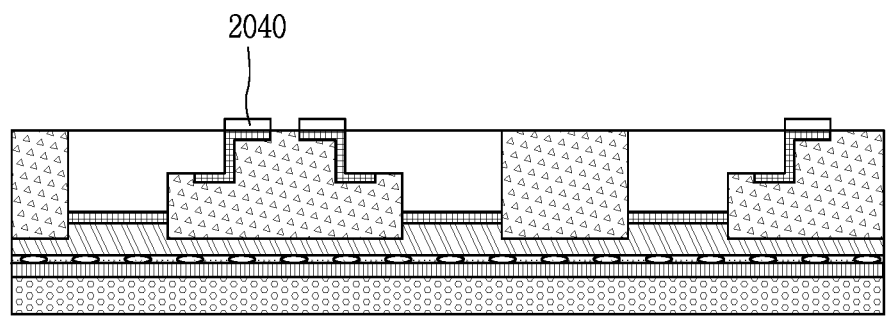

Referring to FIG. 19C, next, the process of electrically connecting the second conductive semiconductor layer to the wiring electrode is performed, and then a phosphor layer is formed to cover the semiconductor light emitting device. For example, the process of separating the semiconductor light emitting device from the substrate, and then removing the undoped semiconductor layer 2153*a*, and connecting the second electrode 2040 to the second conductive electrode 2152 is performed.

The second electrode 2040 is directly connected to the second conductive electrode 2152 as upper wiring. More specifically, the second electrode 2040 is deposited or printed on an upper surface of the insulating layer (a surface which is the farthest from the first conductive semiconductor layer) to form an upper wiring of the semiconductor light emitting device.

Subsequent to the formation of the upper wiring, a phosphor layer or color filter may be deposited on the semiconductor light emitting device to finish a display device. Furthermore, on the process of the fabrication method, a plurality of cracks (CRs) (refer to FIG. 13 or 14) may be formed on the intermediate electrode during the flexure or bending of the display device.

According to the fabrication process, a bonding process margin may be allowed without opening even during the fabrication of high-resolution displays, and a fabrication margin and an bonding margin may coexist on the components in case of large-sized displays, thereby having an advantage capable of controlling a portion on which an open probability of the semiconductor light emitting devices increases.

Further, the present disclosure is not limited to the fabrication method. In another example, as illustrated in FIG. 21 which will be described later, a bonding metal may be also formed on a wiring substrate to selectively bond a semiconductor light emitting device within a growth substrate with the wiring substrate.

Furthermore, as illustrated in FIG. 22, the structure of the present disclosure may be also applicable to a vertical type semiconductor light emitting device. As described above, a display device using the foregoing semiconductor light emitting device may be modified in various forms, and hereinafter, such a modified example will be described.

Figure 20:
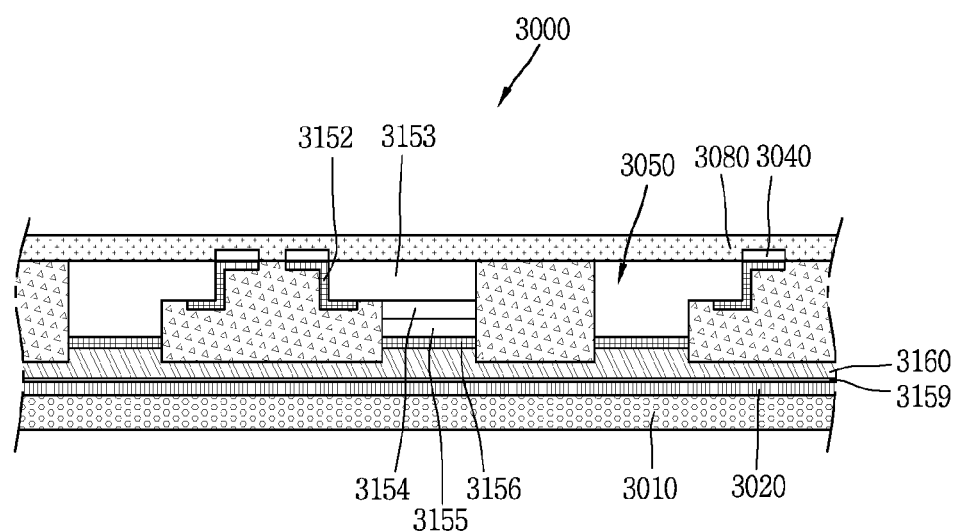
FIGS. 20 and 21 are cross-sectional views illustrating another embodiment of the present disclosure.
Figure 21:
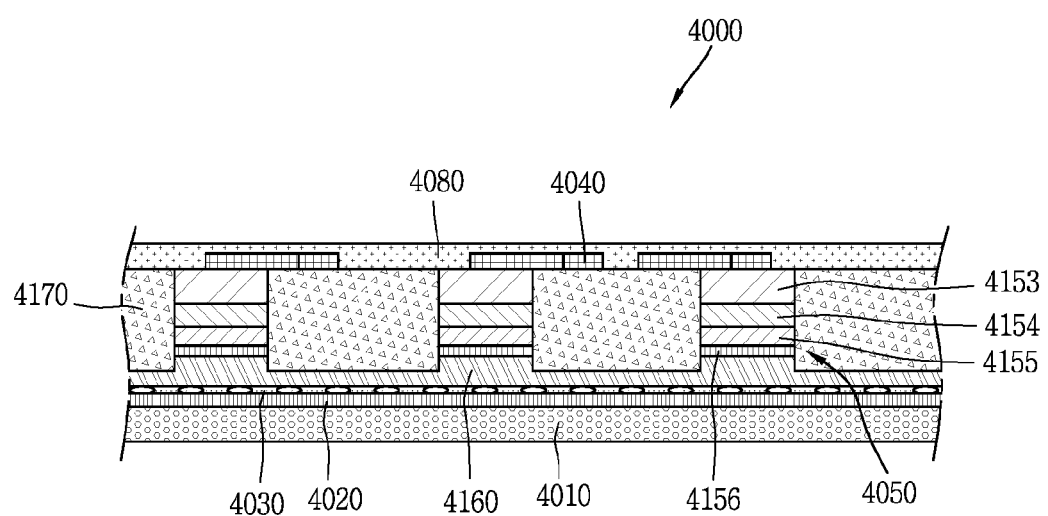

Next, FIGS. 20 and 21 are cross-sectional views illustrating another embodiment of the present disclosure. First, according to the drawing of FIG. 20, a conductive adhesive layer is not required, and a bonding metal is disposed on the first electrode of the wiring substrate, and physically brought into contact with the intermediate electrode.

In this instance, there is illustrated a display device 3000 using a passive matrix (PM) type semiconductor light emitting device as a display device 3000 using a semiconductor light emitting device. However, the following illustration may be also applicable to an active matrix (AM) type semiconductor light emitting device.

The display device 3000 includes a substrate 3010, a first electrode 3020, a second electrode 3040, and a plurality of semiconductor light emitting devices 3050. Here, the first electrode 3020 and second electrode 3040 may include a plurality of electrode lines, respectively. The substrate 3010 as a wiring substrate on which the first electrode 3020 is disposed may include polyimide (PI) to implement a flexible display device. In addition, any one may be used if it is an insulating and flexible material.

The first electrode 3020 may be located on the substrate 3010, and formed with a bar-shaped electrode elongated in one direction. The first electrode 3020 may be formed to perform the role of a data electrode. The second electrode 3040 is disposed at an opposite side to the first electrode around the semiconductor light emitting device.

The plurality of plurality of semiconductor light emitting devices 3050 are coupled to the substrate 3010, and electrically connected to the first electrode 3020 and second electrode 3040. More specifically, a plurality of second electrodes 3040 disposed in a direction of crossing the length direction of the first electrode 3020, and electrically connected to the semiconductor light emitting device 3050 may be located between the semiconductor light emitting devices.

As illustrated in the drawing, the plurality of semiconductor light emitting devices 3050 may form a plurality of columns in a direction in parallel to a plurality of electrode lines provided in the first electrode 3020. However, the present disclosure is not limited to this. For example, the plurality of semiconductor light emitting devices 3050 may form a plurality of columns along the second electrode 3040. Moreover, the display device 3000 may further include a phosphor layer 3080 formed on one surface of a plurality of semiconductor light emitting devices 3050. The description thereof will be substituted by the description described with reference to FIGS. 10, 11A and 11B.

In this instance, the semiconductor light emitting device has the same structure as that of a semiconductor light emitting device described with reference to FIGS. 13 through 17B. For example, the semiconductor light emitting device 3050 may include a first conductive electrode 3156, a first conductive semiconductor layer 3155 formed with the first conductive electrode 3156, an active layer 3154 formed on the first conductive semiconductor layer 3155, and a second conductive semiconductor layer 3153 formed on the active layer 3154 and a second conductive electrode 3152 formed on the second conductive semiconductor layer 3153.

The first conductive electrode 3156 and first conductive semiconductor layer 3155 may be a p-type electrode and a p-type semiconductor layer, respectively, and the second conductive electrode 3152 and second conductive semiconductor layer 3153 may be an n-type electrode and a n-type semiconductor layer, respectively. According to the drawing, the first conductive electrode 3156 is physically brought into contact with the intermediate electrode 3160, and the intermediate electrode 3160 is physically brought into contact with the first electrode 3020.

More specifically, the intermediate electrode 3160 is electrically connected to the first electrode 3020 and the first conductive electrode 3156 of the semiconductor light emitting devices, respectively. For example, the intermediate electrode 3160 is extended along one direction to be electrically connected to the conductive electrodes (specifically, first conductive electrodes 3156) of adjoining semiconductor light emitting devices, respectively, to cover the first conductive electrodes 3156 together, and disposed to face the first electrode 3020 to be electrically connected to the wiring electrode (specifically, first electrode 3020).

One surface of the intermediate electrode 3160 may be directly brought into contact with and electrically connected to the first conductive electrodes 3156, and the other surface thereof may be directly brought into contact with and electrically connected to a bonding metal 3159 coated on a surface of the first electrode 3020.

The intermediate electrode and the first electrode (wiring electrode) may be fixated of a same metal material, and the conductive may be formed of a different metal material from those of the intermediate electrode and the first electrode. For example, the first conductive electrode 3156 may be framed of at least one of TiO, Ti, Pt and Au, and the intermediate electrode 3160 and the first electrode 3020 may be formed of Cu. A coupling bonding metal 3159 is disposed between the intermediate electrode 3160 and the first electrode 3020, and both surfaces of the coupling bonding metal 3159 is pressurized and brought into contact with each other by the intermediate electrode 3160 and the first electrode 3020. In this instance, there is no conductive adhesive layer, and thus the semiconductor light emitting device may be fixed to the wiring substrate by an adhesive force of the insulating layer.

The insulating layer 3170 is configured to cover the plurality of semiconductor light emitting devices, and may include an insulating material filled between the plurality of semiconductor light emitting devices. The detailed description of the insulating layer and insulating material will be substituted by the description described with reference to FIGS. 13 through 17B.

Next, according to FIG. 21, in case of a vertical type semiconductor light emitting device, a structure in which the first conductive electrode is electrically connected to the first electrode by the intermediate electrode is allowed. According to the drawing, the display device 4000 includes a substrate 4010, a first electrode 4020, a conductive adhesive layer 4030, a second electrode 4040 and a plurality of semiconductor light emitting devices 4050. Here, the first electrode 4020 and second electrode 4040 may include a plurality of electrode lines, respectively.

The substrate 4010 as a wiring substrate is an insulating and flexible material as illustrated in a display device to which the foregoing flip chip type light emitting device is applied, and the first electrode 4020 is disposed thereon. The first electrode 4020 as a bar-shaped electrode elongated in one direction may perform the role of a data electrode as illustrated in a display device to which the foregoing flip chip type light emitting device is applied.

The conductive adhesive layer 4030 is formed on the substrate 4010 located with the first electrode 4020. The conductive adhesive layer 4030 may be an anisotropic conductive film (ACF), an anisotropic conductive paste, a solution containing conductive particles, and the like. However, according to the present embodiment, the conductive adhesive layer 4030 may be replaced by an adhesive layer. For example, when the first electrode 4020 is not located on the substrate 4010 but integrally formed with a conductive electrode of the semiconductor light emitting device, the conductivity of the adhesive layer may not be required.

A plurality of second electrodes 4040 disposed in a direction of crossing the length direction of the first electrode 4020, and electrically connected to the vertical semiconductor light emitting device 4050 may be located between the semiconductor light emitting devices. According to the drawing, the second electrode 4040 may be located on the conductive adhesive layer 4030. In other words, the conductive adhesive layer 4030 is disposed between a wiring substrate and the second electrode 4040. The second electrode 4040 may be electrically connected to the semiconductor light emitting device 4050 through contact.

According to the foregoing structure, a plurality of semiconductor light emitting devices 4050 are coupled to the conductive adhesive layer 4030, and electrically connected to the first electrode 4020 and second electrode 4040. As illustrated in the drawing, the plurality of semiconductor light emitting devices 4050 may form a plurality of columns in a direction in parallel to a plurality of electrode lines provided in the first electrode 4020. However, the present disclosure is not limited to this. For example, the plurality of semiconductor light emitting devices 4050 may form a plurality of columns along the second electrode 4040.

Moreover, the display device 4000 may further include a phosphor layer 4080 formed on one surface of the plurality of semiconductor light emitting devices 4050. Further, considering the semiconductor light emitting device 4050 according to the present embodiment, in the semiconductor light emitting device 4050 in the present embodiment, the electrode is disposed on the top/bottom as a vertical structure, thereby having an advantage of reducing the chip size.

For example, the semiconductor light emitting device 4050 may include a first conductive electrode 4156, a first conductive semiconductor layer 4155 formed with the first conductive electrode 4156, an active layer 4154 formed on the first conductive semiconductor layer 4155, and a second conductive semiconductor layer 4153 formed on the active layer 4154. As illustrated in the drawing, the active layer is formed at one side of the second conductive semiconductor layer, and the second electrode 4040 is connected to the other side thereof.

According to the present embodiment, it will be described based on a case where a second conductive electrode is not additionally provided on each semiconductor light emitting device, but the second conductive electrode is integrally formed with the second electrode 4040. In this instance, the second electrode may be formed without the process of depositing the second conductive electrode on each semiconductor light emitting device.

In this instance, the first conductive electrode 4156 and first conductive semiconductor layer 4155 may be a p-type electrode and a p-type semiconductor layer, respectively, and the second electrode 4040 and second conductive semiconductor layer 4153 may be an n-type electrode and an n-type semiconductor layer, respectively. More specifically, the first conductive semiconductor layer 4155 may be a p-type GaN layer and the second conductive semiconductor layer 4153 may be an n-type GaN layer.

In this instance, a p-type electrode located at a lower portion may be electrically connected to the first electrode 4020 by the conductive adhesive layer 4030 via the intermediate electrode 4160, and an n-type electrode may connect adjoining semiconductor light emitting devices to each other as the second electrode 4040.

As illustrated in the drawing, the intermediate electrode 4160 is electrically connected to the first electrode 4020 and the first conductive electrode 4156 of the semiconductor light emitting devices, respectively. For example, the intermediate electrode 4160 may be extended along one direction to be electrically connected to the conductive electrodes (specifically, first conductive electrodes 4156) of adjoining semiconductor light emitting devices, respectively, to cover the conductive electrodes 4156 together, and disposed to face the first electrode 4020 to be electrically connected to the wiring electrode (specifically, first electrode 4020).

The intermediate electrode 4160 may be directly brought into contact with the first conductive electrodes 4156 to be electrically connected thereto. On the contrary, as the intermediate electrode 4160 is brought into contact with the anisotropic conductive media of the conductive adhesive layer 4030, and the anisotropic conductive media is brought into contact with the first electrode 4020, the intermediate electrode 4160 is electrically connected to the first electrode 4020. The detailed structure of the intermediate electrode 4160 is similar to that of an intermediate electrode in a display device to which the foregoing flip chip type light emitting device is applied, and the description thereof will be substituted by the earlier description.

Furthermore, the first conductive electrodes 4156 of the adjoining semiconductor light emitting devices may be separated from each other on a space, but the intermediate electrode 4160 may be electrically connected to the first conductive electrodes 4156, respectively, as an insulating layer 4170 is formed on the separation space. The detailed structure or material of the insulating layer 4170 is similar to those of an insulating layer in a display device to which the foregoing flip chip type light emitting device is applied, and the description thereof will be substituted by the earlier description. As described above, a mechanism for implementing a signal transfer path with higher reliability may be also applicable to a display device using a vertical type semiconductor light emitting device.

The configurations and methods according to the above-described embodiments will not be applicable in a limited way to the foregoing display device using a semiconductor light emitting device, and all or part of each embodiment may be selectively combined and configured to make various modifications thereto.

What is claimed is:

1. A display device, comprising:
 a substrate including a wiring electrode;
 a plurality of semiconductor light emitting devices electrically connected to the wiring electrode; and
 an intermediate electrode extending along one direction to be electrically connected to conductive electrodes of adjoining semiconductor light emitting devices, covering the conductive electrodes, and facing the wiring electrode to be electrically connected to the wiring electrode,
 wherein the intermediate electrode includes a conductive film on the conductive electrodes.

2. The display device of claim 1, further comprising:
 an insulating material filled between the plurality of semiconductor light emitting devices.

3. The display device of claim 2, further comprising:
 an insulating layer including the insulating material, and covering the plurality of semiconductor light emitting devices,
 wherein the intermediate electrode extends on a surface of the insulating material facing the substrate.

4. The display device of claim 3, wherein through holes are formed on the insulating layer so the intermediate electrode is brought into contact with the conductive electrodes.

5. The display device of claim 2, wherein the intermediate electrode comprises a conductive thin film deposited on a surface of the insulating material facing the substrate.

6. The display device of claim 2, wherein the insulating material includes a flexible material.

7. The display device of claim 2, wherein the intermediate electrode includes a plurality of cracks.

8. The display device of claim 7, wherein at least one of the cracks is located between the conductive electrodes of the adjoining semiconductor light emitting devices.

9. The display device of claim 1, wherein the plurality of semiconductor light emitting devices are adhered to a conductive adhesive layer disposed on the substrate, and the conductive adhesive layer comprises a plurality of anisotropic conductive media, and
 wherein a first part of the anisotropic conductive media is connected to the intermediate electrode and the wiring electrode, respectively, at positions overlapping with the conductive electrodes.

10. The display device of claim 9, wherein a second part of the anisotropic conductive media is connected to the intermediate electrode and the wiring electrode, respectively, at positions not overlapping with the conductive electrodes.

11. The display device of claim 9, wherein the intermediate electrode and the wiring electrode are electrically connected to each other by the anisotropic conductive media in a state of not being aligned in parallel.

12. The display device of claim 1, wherein each of the plurality of semiconductor light emitting devices comprises a first conductive electrode, a second conductive electrode, a first conductive semiconductor layer, a second conductive semiconductor layer and an active layer, wherein the first conductive electrode is formed on one surface of the first conductive semiconductor layer, the active layer is formed between the first conductive semiconductor layer and the second conductive semiconductor layer, and the second conductive electrode is formed on the second conductive semiconductor layer, and wherein the intermediate electrode is electrically connected to the first conductive electrodes of the adjoining semiconductor light emitting devices.

13. The display device of claim 12, wherein the intermediate electrode comprises a plurality of lines driven as a common electrode of the first conductive electrodes.

14. The display device of claim 12, wherein the wiring electrode is a data line for transmitting a data signal, and wherein the intermediate electrode is connected to the second conductive electrodes to cross perpendicular to a scan line for transmitting a scan signal.

15. The display device of claim 14, wherein the scan line corresponds to a printing electrode, and has a larger width than that of the intermediate electrode.

16. The display device of claim 1, wherein the intermediate electrode and the wiring electrode include a same metal material.

17. The display device of claim 16, wherein the conductive electrodes include a different metal material from those of the intermediate electrode and the wiring electrode.

18. A method of fabricating a display device, the method comprising:
sequentially growing a first conductive semiconductor layer, an active layer and a second conductive semiconductor layer on a substrate;
forming a plurality of semiconductor light emitting devices on the substrate through etching;
forming a conductive electrode on the first conductive semiconductor layer;
coating an insulating material on the substrate to cover the semiconductor light emitting devices;
removing part of the insulating material to expose the conductive electrode;
forming an intermediate electrode electrically connected to conductive electrodes of adjoining semiconductor light emitting devices; and
electrically connecting the intermediate electrode to a wiring electrode on a wiring substrate.

19. The method of claim 18, wherein the intermediate electrode comprises a conductive thin film deposited on one surface of the insulating material and electrically connected to the conductive electrodes.

20. The method of claim 18, further comprising:
separating the semiconductor light emitting devices from the substrate using a laser beam, and connecting a second conductive electrode of the second conductive semiconductor layer to a second electrode.

* * * * *